(12) United States Patent
Kim et al.

(10) Patent No.: US 12,402,406 B2
(45) Date of Patent: Aug. 26, 2025

(54) SEMICONDUCTOR INTEGRATED CIRCUIT DEVICE AND MANUFACTURING METHOD THEREOF

(71) Applicant: SAMSUNG ELECTRONICS CO., LTD., Suwon-si (KR)

(72) Inventors: Changhee Kim, Suwon-si (KR);
Kyungsoo Kim, Hwaseong-si (KR);
Dongil Bae, Seongnam-si (KR);
Sungman Whang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 839 days.

(21) Appl. No.: 17/561,867

(22) Filed: Dec. 24, 2021

(65) Prior Publication Data
US 2022/0399331 A1    Dec. 15, 2022

(30) Foreign Application Priority Data
Jun. 11, 2021    (KR) ........................ 10-2021-0075926

(51) Int. Cl.
| | |
|---|---|
| *H10D 84/85* | (2025.01) |
| *H01L 21/02* | (2006.01) |
| *H10D 30/01* | (2025.01) |
| *H10D 30/67* | (2025.01) |

(Continued)

(52) U.S. Cl.
CPC ......... *H10D 84/85* (2025.01); *H01L 21/0259* (2013.01); *H10D 30/031* (2025.01);
(Continued)

(58) Field of Classification Search
CPC .. H10D 84/85; H10D 30/031; H10D 30/0415; H10D 30/6713; H10D 30/6735; H10D 30/6757; H10D 30/701; H10D 62/118; H10D 64/017; H10D 64/018; H10D 84/0167; H10D 84/017; H10D 84/0181;
(Continued)

(56) References Cited

U.S. PATENT DOCUMENTS

| | | |
|---|---|---|
| 8,759,168 B2 | 6/2014 | Cheng et al. |
| 9,305,846 B2 | 4/2016 | Jacob et al. |

(Continued)

FOREIGN PATENT DOCUMENTS

| | | | |
|---|---|---|---|
| CN | 109755290 A | * | 5/2019 |
| KR | 20170048112 A |  | 5/2017 |

*Primary Examiner* — Jay C Kim
*Assistant Examiner* — Woo K Lee
(74) *Attorney, Agent, or Firm* — MORGAN, LEWIS & BOCKIUS LLP

(57) ABSTRACT

A semiconductor integrated circuit device including a substrate with a first element region of a P type and a second element region of an N type, a channel active region that extends in the first element region or the second element region, the channel active region including a plurality of channels, a plurality of gate lines that extend in a second direction intersecting and include a gate metal layer, and a gate insulating film in contact with the gate metal layer, a plurality of first spacers on opposite side portions of respective ones of the gate lines, and a plurality of source/drain regions that are between ones of the plurality of gate lines. The channel active region includes a first channel directly on the substrate, and a second channel spaced apart from the first channel and extends into the gate metal layer.

20 Claims, 38 Drawing Sheets

(51) Int. Cl.
*H10D 30/69* (2025.01)
*H10D 62/10* (2025.01)
*H10D 64/01* (2025.01)
*H10D 84/01* (2025.01)
*H10D 84/03* (2025.01)

(52) U.S. Cl.
CPC ..... *H10D 30/0415* (2025.01); *H10D 30/6713* (2025.01); *H10D 30/6735* (2025.01); *H10D 30/6757* (2025.01); *H10D 30/701* (2025.01); *H10D 62/118* (2025.01); *H10D 64/017* (2025.01); *H10D 64/018* (2025.01); *H10D 84/0167* (2025.01); *H10D 84/017* (2025.01); *H10D 84/0181* (2025.01); *H10D 84/0184* (2025.01); *H10D 84/038* (2025.01)

(58) Field of Classification Search
CPC .............. H10D 84/0184; H10D 84/038; H01L 21/0259
See application file for complete search history.

(56) References Cited

U.S. PATENT DOCUMENTS

| | | |
|---|---|---|
| 9,306,001 B1 | 4/2016 | Cai et al. |
| 9,590,038 B1 | 3/2017 | Kim et al. |
| 9,716,142 B2 | 7/2017 | Bi et al. |
| 10,431,585 B2 | 10/2019 | Yang et al. |
| 10,431,651 B1 | 10/2019 | Chao et al. |
| 10,431,690 B2 | 10/2019 | Rachmady et al. |
| 10,580,897 B2 | 3/2020 | Pawlak |
| 2013/0302962 A1 | 11/2013 | Cheng et al. |
| 2015/0140761 A1 | 5/2015 | Jacob et al. |
| 2017/0104062 A1 | 4/2017 | Bi et al. |
| 2018/0158957 A1 | 6/2018 | Rachmady et al. |
| 2018/0175035 A1 | 6/2018 | Yang et al. |
| 2018/0374946 A1 | 12/2018 | Pawlak |
| 2021/0066506 A1 | 3/2021 | Liaw |

\* cited by examiner

SEMICONDUCTOR INTEGRATED CIRCUIT DEVICE AND MANUFACTURING METHOD THEREOF

CROSS-REFERENCE TO THE RELATED APPLICATION

This application claims priority from Korean Patent Application No. 10-2021-0075926, filed on Jun. 11, 2021, in the Korean Intellectual Property Office, the disclosure of which is incorporated herein by reference in its entirety.

BACKGROUND

The example embodiments of the disclosure relate to a semiconductor integrated circuit device and a manufacturing method thereof.

In accordance with rapid advance of electronic industries and user demand, electronic appliances are being further miniaturized and multifunctionalized. Accordingly, down-scaling of a semiconductor integrated circuit device is rapidly progressing, and the line width and pitch of a multilayer wiring structure included in the semiconductor integrated circuit are further decreasing.

As a result, there may be a phenomenon in which current leakage through a channel between adjacent source/drain regions occurs. In order to reduce such a current leakage phenomenon, a structure has been proposed in which an insulating (dielectric) material is formed between a source/drain region and a substrate in order to space the source/drain region and the substrate apart from each other.

SUMMARY

The example embodiments of the disclosure provide a semiconductor integrated circuit device having a structure capable of minimizing or reducing current leakage between adjacent source/drain regions without formation of an insulating dielectric material spacing a source/drain region and a substrate apart from each other, and a manufacturing method thereof.

According to some embodiments of the present disclosure, there is provided a semiconductor integrated circuit device. The semiconductor integrated circuit device includes a substrate including a first element region of a P type and a second element region of an N type, a channel active region that extends into the first element region or the second element region in a first direction, the channel active region including a plurality of channels, a plurality of gate lines that extend in a second direction intersecting the first direction and include a gate metal layer, and a gate insulating film in contact with the gate metal layer, a plurality of first spacers on opposite side portions of the plurality of gate lines and separated from one another, and a plurality of source/drain regions that are between the plurality of gate lines. The channel active region includes a first channel directly on the substrate, and a second channel spaced apart from the first channel in a third direction perpendicular to the first direction and the second direction and extends into the gate metal layer. A width in the first direction of the second channel is greater than respective widths in the first direction of the gate metal layer and the gate insulating film that are between the first channel and the second channel. The first channel, the second channel, and portions of the gate lines between the first channel and the second channel have a first groove therebetween. A first spacer of the first spacers includes a first section in the first groove and a second section that penetrates a first source/drain region of the plurality of source/drain regions.

According to some embodiments of the present disclosure, there is provided a semiconductor integrated circuit device. The semiconductor integrated circuit device includes a substrate including a first element region of a P type and a second element region of an N type, a channel active region that extends into the first element region or the second element region in a first direction, the channel active region includes a plurality of channels, a plurality of gate lines that extend in a second direction intersecting the first direction and each of the plurality of gate lines includes a gate metal layer and a gate insulating film in contact with the gate metal layer, source/drain regions that are between the plurality of gate lines such that a first source/drain region includes a first epitaxial region and a second epitaxial region of different conductivity types, and a plurality of first spacers on opposite side portions of the plurality of gate lines. A first spacer of the plurality of first spacers is between the first epitaxial region and the second epitaxial region of the first source/drain region, and overlaps a respective one of the plurality of gate lines in the first direction.

According to some embodiments of the present disclosure, there is provided a semiconductor integrated circuit device. The semiconductor integrated circuit device includes a substrate including a first element region of a P type and a second element region of an N type, a channel active region that extends into the first element region or the second element region in a first direction, the channel active region including a plurality of channels, a plurality of gate lines that extend in a second direction intersecting the first direction and each includes a gate metal layer and a gate insulating film in contact with the gate metal layer, a plurality of spacers on opposite side portions of the gate lines and are separated from one another, and a plurality of source/drain regions that are between the plurality of gate lines. The channel active region includes a first channel directly on the substrate, a second channel spaced apart from the first channel in a third direction perpendicular to the first direction and the second direction and extending into the gate metal layer, and a third channel spaced apart from the second channel in the third direction and extends into the gate metal layer. Respective widths in the first direction of the second channel and the third channel are greater than respective widths in the first direction of the gate metal layer and the gate insulating film that are between the first channel and the second channel. The first channel, the second channel, and respective portions of first ones of the gate lines between the first channel and the second channel have a second groove therebetween. The second channel, the third channel, respective portions of ones of the gate lines between the second channel and the third channel form a second groove. The plurality of spacers includes a first spacer including a first section in the first groove, and a second section that penetrates a first source/drain region of the plurality of source/drain regions, a second spacer in the second groove, a third spacer on the third channel at an outside of a part of a respective one of the gate lines, and a fourth spacer on the third channel at an outside of the third spacer. The first source/drain region includes a first epitaxial region and a second epitaxial region of different conductivity types. The first spacer is directly on the first epitaxial region and contacts the second epitaxial region. The second spacer is directly on the second epitaxial region.

DETAILED DESCRIPTION

Figure 1:
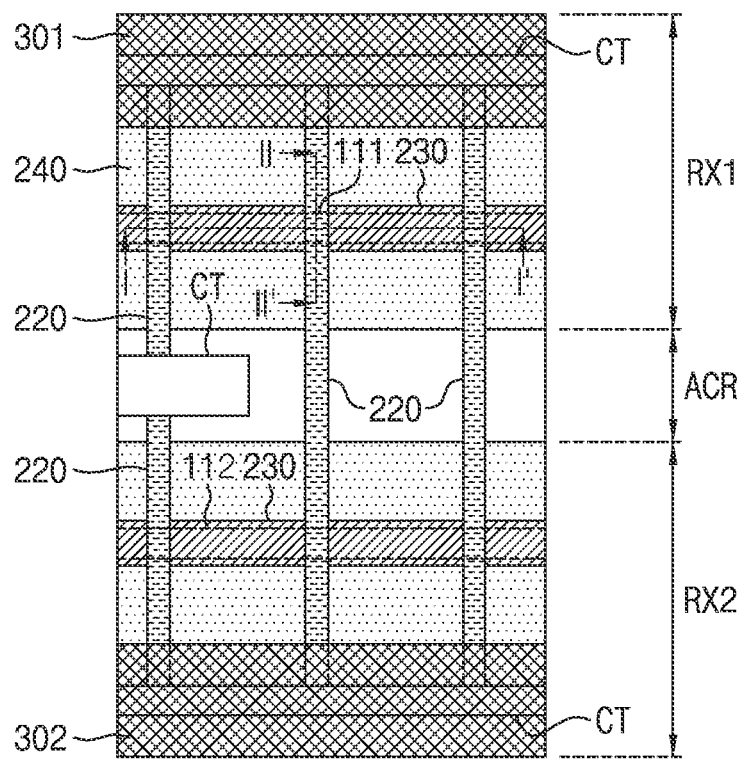
FIG. 1 is a schematic layout view of a semiconductor integrated circuit device according to example embodiments of the disclosure.

FIG. 1 is a schematic layout view of a semiconductor integrated circuit device according to example embodiments of the disclosure.

In the specification, a first direction D1 and a second direction D2 may refer to horizontal directions, that is, directions intersecting on a horizontal plane, respectively, and a third direction D3 may refer to a vertical direction. For example, the first direction D1 may correspond to an X-axis direction, the second direction D2 may correspond to a Y-axis direction, and the third direction D3 may correspond to a Z-axis direction. The plane formed in the first direction D1 and the second direction D2 may be a horizontal plane.

Referring to FIG. 1, the semiconductor integrated circuit device may include a first-type well having a predetermined width and extending in the first direction D1, and a second-type well disposed adjacent to the first-type well while having a predetermined width and extending in the first direction D1. Here, a region where the first-type well is formed is defined as a first element region RX1, and a region where the second-type well is formed is defined as a second element region RX2. In some embodiments, the first-type well is a well of one of a P type or an N type, and the second-type well is a well of the other of the P type or the N type.

Although not clearly shown, the first element region RX1 and the second element region RX2 may be adjacent to each other in the second direction D2. In some embodiments, the first-type well and the second-type well may be formed on a substrate (cf. "101" in FIG. 2). That is, the first element region RX1 and the second element region RX2 may be regions on the substrate. In some embodiments, widths of the first element region RX1 and the second element region RX2 (widths in the second direction D2) are equal.

The substrate may include a semiconductor such as Si or Ge, or a compound semiconductor such as SiGe, SiC, GaAs, InAs, or InP. The substrate may include a conductive region, for example, a well doped with impurities or a structure doped with impurities.

In some embodiments, the first element region RX1 and the second element region RX2, which are formed with a plurality of channel active regions 111 and 112 (or fin-type channel active regions), and an active cut region ACR separating the first element region RX1 and the second element region RX2 from each other may be defined at the substrate. Each of the first element region RX1, the active cut region ACR, and the second element region RX2 may extend in the first direction D1. The first element region RX1, the active cut region ACR, and the second element region RX2 may be arranged in the second direction D2.

The plurality of channel active regions 111 and 112 may have a shape protruding from the substrate or may be formed on the substrate. The plurality of channel active regions 111 and 112 may extend in parallel in the first direction D1. The plurality of channel active regions may be arranged in the second direction D2. The plurality of channel active regions may include a first channel active region 111 formed in the first element region RX1, and a second channel active region 112 formed in the second element region RX2. In some embodiments, the first channel active region 111 is of the P type, and the second channel active region 112 may be of the N type.

The semiconductor integrated circuit device may include a plurality of gate lines 220 extending in the second direction D2. Each gate line 220 may intersect the plurality of channel active regions 111 and 112. The semiconductor integrated circuit device may further include a transistor and additional patterns for routing in accordance with a desired function, on the basis of the structure of the semiconductor integrated circuit device. In some embodiments, a part of the gate lines 220 may have a shape in which the gate lines 220 are divided in the second direction D2 by, for example, an etching process. For example, a part of the gate lines 220 extending in the second direction D2 may be divided by the gate cut region CT.

The gate line 220 may include a layer containing a work function metal and a gap-fill metal film. For example, the layer containing the work function metal may include at least one metal of Ti, W, Ru, Nb, Mo, Hf, Ni, Co, Pt, Yb, Tb, Dy, Er or Pd, and the gap-fill metal film may be a W film or an Al film. In some embodiments, the gate lines 220 may include a stack structure of TiAlC/TiN/W, a stack structure of TiN/TaN/TiAlC/TiN/W, or a stack structure of TiN/TaN/TiAlC/TiN/W.

The semiconductor integrated circuit device may include a first power line 301 extending in the first direction D1 while being configured to receive a first voltage, and a second power line 302 extending in the first direction D1 while being configured to receive a second voltage lower than the first voltage. The first power line 301 and the second power line 302 may be disposed at one wiring layer M1 of a back-end-of-line (BEOL) structure on a front-end-of-line (FEOL) structure.

In accordance with some embodiments, the first voltage may be a positive voltage, and the second voltage may be a negative voltage or a ground voltage. The first power line 301 and the second power line 302 may be spaced apart from each other by a predetermined pitch, and may be alternately disposed in the second direction D2. For example, the first power line 301 may be disposed on the first element region RX1, and the second power line 302 may be disposed on the second element region RX2. In accordance with some embodiments, the first power line 301 and the second power line 302 may be formed to overlap with portions of the gate lines 220. The first power line 301 and the second power line 302 may be electrically connected to the gate lines 220 and/or the source/drain regions 230.

The source/drain regions 230 may be formed at opposite sides of one gate line 220. The source/drain regions 230 may be formed among the gate lines 220. The source/drain regions 230 may overlap with the first channel active region 111 and the second channel active region 112. In some embodiments, the source/drain region 230 may be configured by an impurity ion implantation region formed at portions of the first channel active region 111 and the second channel active region 112, a semiconductor epitaxial layer epitaxially grown from recess regions formed in the channel active regions 111 and 112, or a combination thereof.

A plurality of gate cut regions CT may be formed to overlap with the first power line 301, the second power line 302 and the active cut region ACR. A part of the gate cut regions CT may have a shape extending in the first direction D1 while overlapping with the first power line 301 and the second power line 302. Another part of the gate cut regions CT may be formed to overlap with the active cut region ACR, thereby dividing a part of the gate lines 220 extending in the second direction D2.

Figure 2:
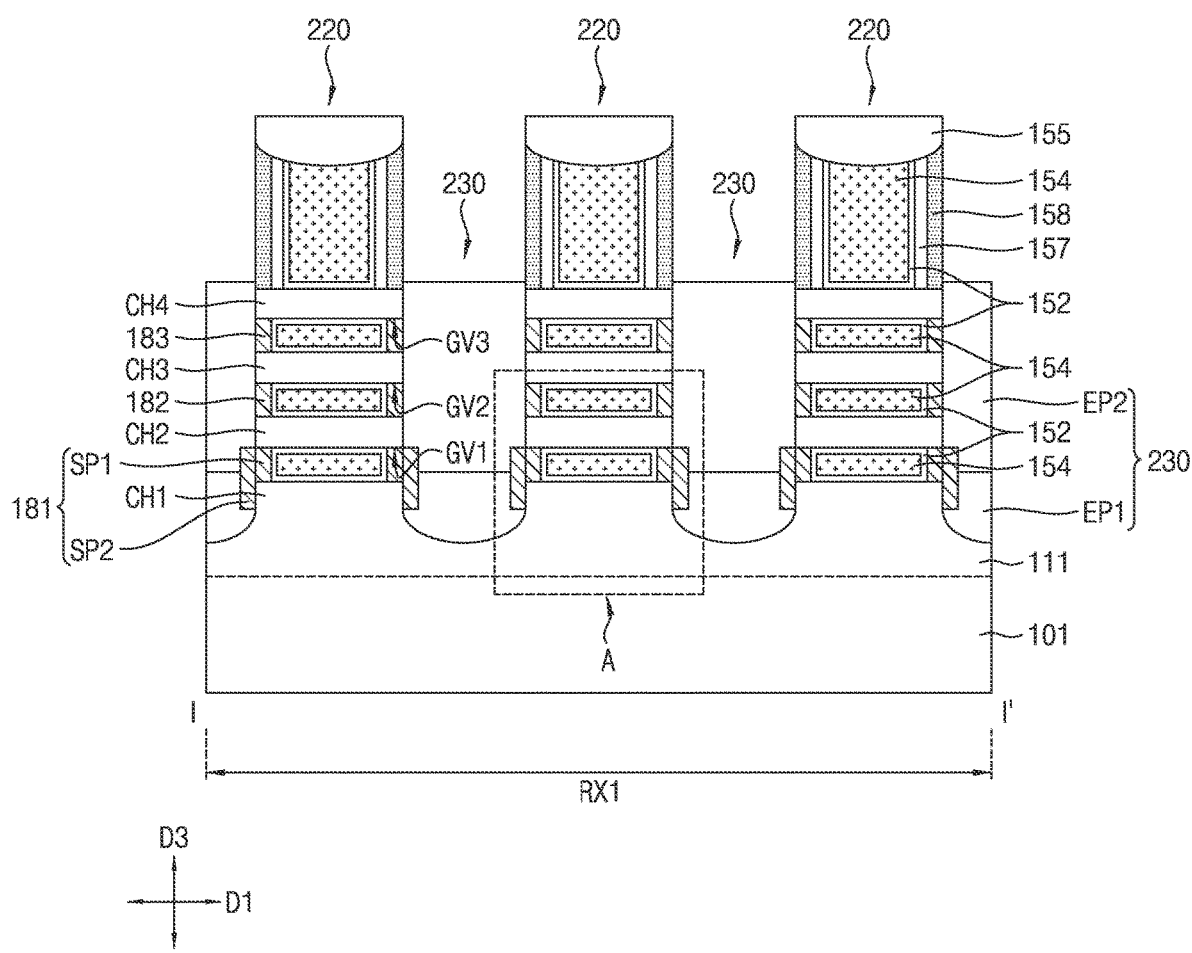
FIG. 2 is a schematic cross-sectional view of the semiconductor integrated circuit device taken along line I-I' in FIG. 1.
Figure 3:
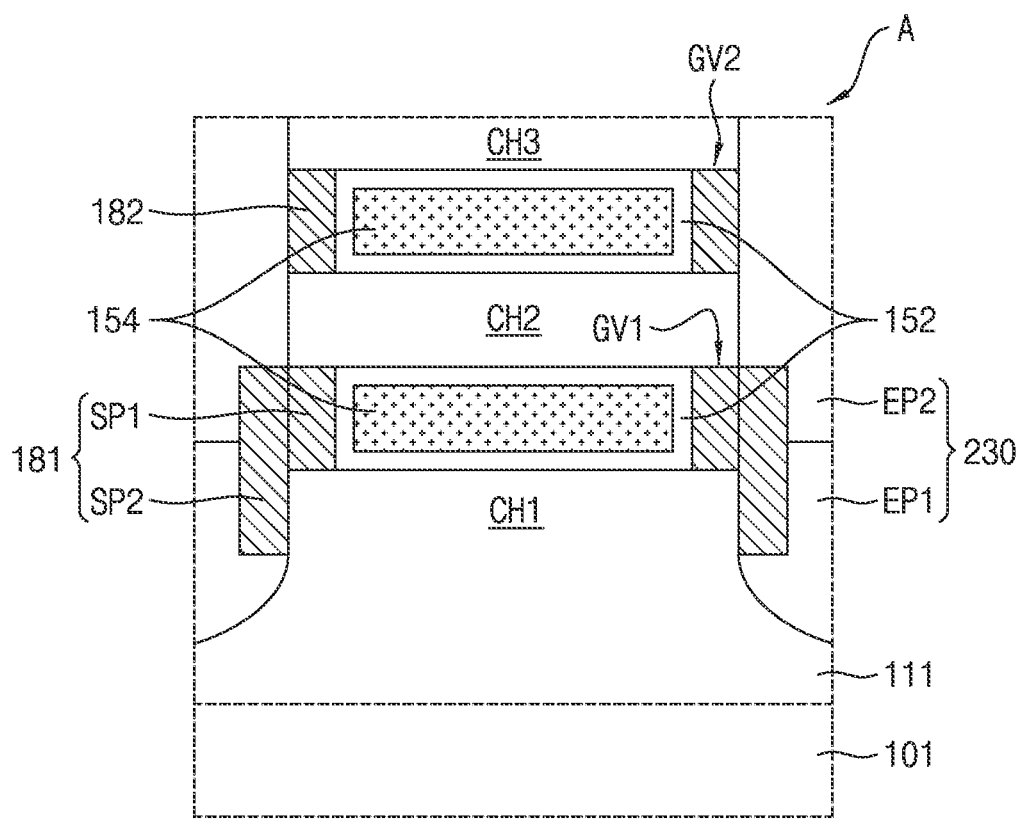
FIG. 3 is an enlarged view of a portion A of FIG. 2.
Figure 4:
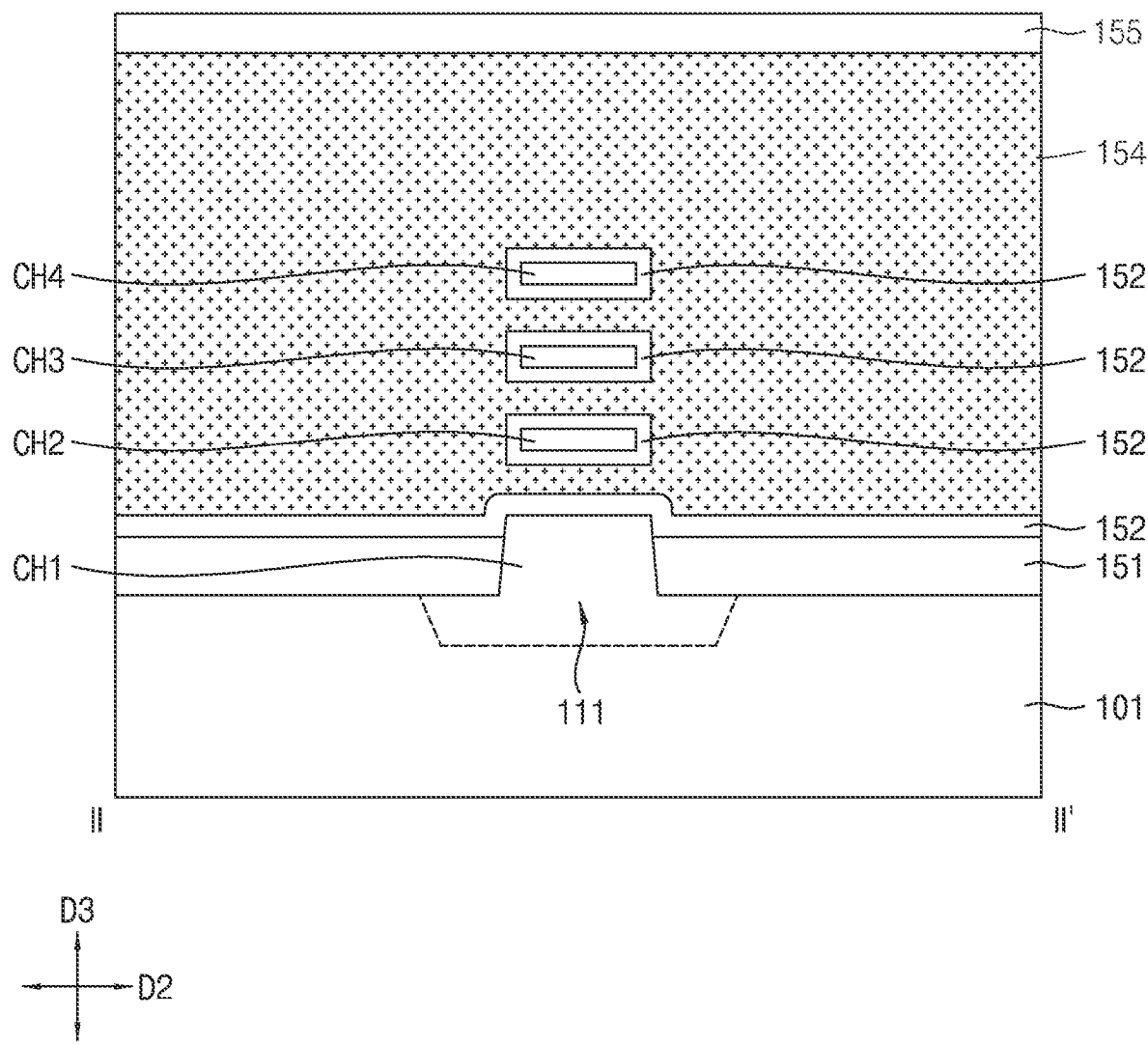
FIG. 4 is a schematic cross-sectional view of the semiconductor integrated circuit device taken along line II-II' in FIG. 1.

FIG. 2 is a schematic cross-sectional view of the semiconductor integrated circuit device taken along line I-I' in FIG. 1. FIG. 3 is an enlarged view of a portion A of FIG. 2. FIG. 4 is a schematic cross-sectional view of the semiconductor integrated circuit device taken along line II-IF in FIG. 1.

Referring to FIGS. 1 to 4, a substrate 101 may include the channel active regions 111 and 112 which have a shape protruding upwards from one surface (for example, an active surface) of the substrate 101. In FIGS. 2 to 4, only the first channel region 111, which is formed in the first element region RX1, is illustrated.

An FEOL structure may be disposed on the substrate 101. The FEOL structure may be formed by an FEOL process. The FEOL process may refer to a process for forming individual elements, for example, a transistor, a capacitor, a resistor, etc., on the substrate 101 in a manufacturing procedure for the integrated circuit chip. For example, the FEOL process may include planarization and cleaning of a wafer, formation of a trench, formation of a well, formation of a gate line, formation of a source and drain, etc.

In some embodiments, the FEOL structure may include a logic cell including a multi-bridge channel FET (MBCFET). Of course, the FEOL structure is not limited to the above-described condition, and may include a logic cell including a metal-oxide-semiconductor field effect transistor (MOS-FET), a fin field effect transistor (FinFET), a system large scale integration (LSI) device, a microelectromechanical system (MEMS), an active device, or a passive device which includes a plurality of transistors, so long as the scope and spirit of the disclosure are not changed. In the following description, description of the example embodiments of the disclosure will be given mainly in conjunction with the substrate and the FEOL structure.

The semiconductor integrated circuit device may include a lower insulating film 151 disposed on the substrate 101. The lower insulating film 151 may extend to have a predetermined thickness on opposite side portions of the channel active regions 111 and 112 and on the substrate 101. The lower insulating film 151 may be disposed around regions beneath opposite side surfaces of the channel active regions 111 and 112. The lower insulating film 151 may include an insulating material. For example, the lower insulating film 151 may include silicon oxide, silicon nitride and/or silicon oxynitride.

Each of the channel active regions 111 and 112 may include a plurality of channels formed to be spaced apart from one another. For example, each of the channel active regions 111 and 112 may include first to fourth channels CH1 to CH4. The first to fourth channels CH1 to CH4 may include the same material. The function and material of each of the channels CH1 to CH4 may be varied in accordance with whether the semiconductor integrated circuit device is of a PMOS type or an NMOS type.

The first channel CH1 may be a channel protruding from the substrate 101. The first channel CH1 may be a region of an upper portion of the substrate 101 and a region directly protruding from the substrate 101 in the third direction D3. For example, one first channel CH1 may be provided for each channel active region 111. In accordance with some embodiments, the first channel CH1 may not substantially perform a channel function of a transistor.

The second channel CH2 may be spaced apart from the first channel CH1 in the third direction D3. The second channel CH2 may extend through the gate line 220 while extending in the first direction D1. The second channel CH2 may have a wire pattern shape. The second channel CH2 may overlap with the first channel CH1 in the third direction D3. In some embodiments, the width of the second channel CH2 may be equal to the width of the first channel CH1. The second channel CH2 may perform a channel function of a transistor.

The third channel CH3 may be spaced apart from the second channel CH2 in the third direction D3. The third channel CH3 may extend through the gate line 220 while extending in the first direction D1. The third channel CH3 may have a wire pattern shape. The third channel CH3 may overlap with the first channel CH1 and the second channel CH2 in the third direction D3. In some embodiments, the width of the third channel CH3 may be equal to the width of the first channel CH1. The third channel CH3 may perform a channel function of a transistor.

The fourth channel CH4 may be spaced apart from the third channel CH3 in the third direction D3. The fourth channel CH4 may extend through the gate line 220 while extending in the first direction D1. The fourth channel CH4 may have a wire pattern shape. The fourth channel CH4 may overlap with the first to third channels CH1 to CH3 in the third direction D3. In some embodiments, the width of the fourth channel CH4 may be equal to the width of the first channel CH1. The fourth channel CH4 may perform a channel function of a transistor.

In some embodiments, each width of the first to fourth channels CH1 to CH4 may be greater than the width (for example, the width in the first direction D1) of the gate line 220. The first channel CH1 and the second channel CH2 may include a first groove GV1 together with a portion of the gate line 220 formed between the first channel CH1 and the second channel CH2. The second channel CH2 and the third channel CH3 may include a second groove GV2 together with a portion of the gate line 220 formed between the second channel CH2 and the third channel CH3. The third channel CH3 and the fourth channel CH4 may include a third groove GV3 together with a portion of the gate line 220 formed between the third channel CH3 and the fourth channel CH4. The first to third grooves GV1 to GV3 may be formed such that two grooves are disposed at opposite sides with reference to one gate line 220, respectively.

In accordance with some embodiments, at least one of the third channel CH3 and the fourth channel CH4 may be omitted.

A gate insulating film 152 may be disposed on a portion of the lower insulating film 151. In addition, the gate insulating film 152 may be disposed on the channel active regions 111 and 112. For example, the gate insulating film 152 may be formed between each of the first to fourth channels CH1 to CH4 and a gate metal layer 154. The gate insulating film 152 may be conformally formed along peripheries of the second to fourth channels CH2 to CH4.

The gate insulating film 152 may include a silicon oxide film, a high-k dielectric film, or a combination thereof. The gate insulating film 152 may be formed by an atomic layer deposition (ALD) process, a chemical vapor deposition (CVD) process or a physical vapor deposition (PVD) process.

In accordance with some embodiments, the semiconductor integrated circuit device may include a negative capacitance (NC) FET using a negative capacitor. For example, the gate insulating film 152 may include a ferroelectric material film having ferroelectric characteristics, and a paraelectric material film having paraelectric characteristics.

The ferroelectric material film may have a negative capacitance, and the paraelectric material film may have a positive capacitance. For example, when two or more capacitors are connected in series, and the capacitance of each of the capacitors has a positive value, the total capacitance of the capacitors may be lower than the capacitance of each individual capacitor. On the other hand, when at least one of the capacitances of two or more capacitors connected in series has a negative value, the total capacitance of the capacitors may have a positive value and may be greater than an absolute value of the capacitance of each individual capacitor.

When a ferroelectric material film having a negative capacitance and a paraelectric material film having a positive capacitance are connected in series, the total capacitance of the ferroelectric material film and the paraelectric material film connected in series may increase. A transistor including a ferroelectric material film may have subthreshold swing (SS) of less than 60 mV/decade at normal temperature, using an increase in total capacitance as described above.

The ferroelectric material film may have ferroelectric dielectric characteristics. The ferroelectric material film may include, for example, at least one of hafnium oxide, hafnium zirconium oxide, barium strontium titanium oxide, barium titanium oxide, and/or lead zirconium titanium oxide. Here, for example, hafnium zirconium oxide may be a material produced by doping hafnium oxide with zirconium (Zr). In another example, hafnium zirconium oxide may be a compound of hafnium (Hf), zirconium (Zr), and oxygen (O).

The ferroelectric material film may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopant included in the ferroelectric material film may be varied in accordance with which ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may include 3 to 8 atomic % (at %) of aluminum. Here, the ratio of the dopant may be the ratio of aluminum to the sum of hafnium and aluminum.

When the dopant is silicon (Si), the ferroelectric material film may include 2 to 10 at % of silicon. When the dopant is yttrium (Y), the ferroelectric material film may include 2 to 10 at % of yttrium. When the dopant is gadolinium (Gd), the ferroelectric material film may include 1 to 7 at % of gadolinium. When the dopant is zirconium (Zr), the ferroelectric material film may include 50 to 80 at % of zirconium.

The paraelectric material film may have paraelectric characteristics. The paraelectric material film may include, for example, at least one of silicon oxide and a metal oxide having a high dielectric constant. The metal oxide included in the paraelectric material film may include, for example, at least one of hafnium oxide, zirconium oxide, and aluminum oxide, without being limited thereto.

The ferroelectric material film and the paraelectric material film may include the same material. The ferroelectric material film has ferroelectric characteristics, but the paraelectric material film may not have ferroelectric characteristics. For example, when both the ferroelectric material film and the paraelectric material film include hafnium oxide, the crystalline structure of the hafnium oxide included in the ferroelectric material film may differ from the crystalline structure of the hafnium oxide included in the paraelectric material film.

The ferroelectric material film may have a thickness exhibiting ferroelectric characteristics. The thickness of the ferroelectric material film may be, for example, 0.5 to 10 nm, without being limited thereto. The critical thickness exhibiting ferroelectric characteristics may be varied in accordance with different ferroelectric materials and, as such, the thickness of the ferroelectric material film may be varied in accordance with the ferroelectric material thereof.

For example, the gate insulating film 152 may include one ferroelectric material film. In another example, the gate insulating film 152 may include a plurality of ferroelectric material films spaced apart from one another. In this case, the gate insulating film 152 may have a stacked film structure in which a plurality of ferroelectric material films and a plurality of paraelectric material films are alternately stacked.

The gate metal layer 154 may be disposed on the gate insulating film 152 and among the first to fourth channels CH1 to CH4. The gate metal layer 154 may function to adjust a work function. For example, the gate metal layer 154 may include at least one of TiN, WN, TaN, Ru, TiC, TaC, Ti, Ag, Al, TiAl, TiAlN, TiAlC, TaCN, TaSiN, Mn, and/or Zr. The gate metal layer 154 and the gate insulating film 152 may form the above-described gate line 220.

In some embodiments, each source/drain region 230 may include a plurality of sequentially stacked epitaxial regions. For example, each source/drain region 230 may include a first epitaxial region EP1, and a second epitaxial region EP2 disposed on the first epitaxial region EP1.

The first epitaxial region EP1 may be directly disposed on the channel active regions 111 and 112. The first epitaxial region EP1 may contact the first channel CH1. The second epitaxial region EP2 may be directly disposed on the first epitaxial region EP1.

The second epitaxial region EP2 may be disposed between the second to fourth channels CH2 to CH4 adjacent to each other. The second epitaxial region EP2 may contact the adjacent second to fourth channels CH2 to CH4. In some embodiments, the position of a bottom surface of the second epitaxial region EP2 may be lower than the position where the second channel CH2 is formed, and the position of a top surface of the second epitaxial region EP2 may be higher than the position where the fourth channel CH4 is formed. In some embodiments, the thickness (the thickness in a vertical direction) of the second epitaxial region EP2 may be greater than the thickness of the first epitaxial region EP1.

In some embodiments, the first epitaxial region EP1 and the second epitaxial region EP2 may be of different types, respectively. In some embodiments, the first epitaxial region EP1 may be of the same type as the element region of the substrate 101 formed with the source/drain region 230, and the second epitaxial region EP2 may be of a type different from that of the first epitaxial region EP1. For example, when the first element region RX1 is of the P type, the first epitaxial region EP1 of the source/drain region 230 formed in the first element region RX1 may be of the P type, and the second epitaxial region EP2 may be of the N type. In this case, the first epitaxial region EP1 of the source/drain region 230 formed in the second element region RX2 may be of the N type, and the second epitaxial region EP2 may be of the P type.

In some embodiments, the first epitaxial region EP1 and the second epitaxial region EP2 may be of the same type. In some embodiments, the first epitaxial region EP1 and the second epitaxial region EP2 may be of a type different from that of the element region of the substrate 101 formed with the source/drain region 230. For example, when the first element region RX1 is of the P type, the first epitaxial region EP1 of the source/drain region 230 formed in the first element region RX1 may be of the N type, and the second epitaxial region EP2 may be of the N type. In this case, the first epitaxial region EP1 of the source/drain region 230 formed in the second element region RX2 may be of the P type, and the second epitaxial region EP2 may be of the P type.

A plurality of spacers may be disposed at opposite side portions of the gate line 220 while being separate from one another. That is, a plurality of spacers may be disposed at side portions of the gate insulating film surrounding the gate metal layer. For example, the spacers may include a first spacer 181 formed to penetrate the source/drain region 230 while filling the first groove GV1 between the first channel CH1 and CH2, a second spacer 182 formed to fill the second groove G2 between the second channel CH2 and the third channel CH3, a third spacer 183 formed to fill the third groove GV3 between the third channel CH3 and the fourth channel CH4, a fourth spacer 157 surrounding opposite side portions of the gate line 220 on the fourth channel CH4, and a fifth spacer 158 surrounding an outside of the fourth spacer 157.

In some embodiments, the first spacer 181 may include a first section SP1 filling the first groove GV1 between the first channel CH1 and the second channel CH2 while overlapping with the first channel CH1 and the second channel CH2 in a vertical direction (the third direction D3), and a second section SP2 penetrating the source/drain region 230. The first section SP1 may overlap with the first channel CH1 and the second channel CH2 in the third direction D3. The second section SP2 may overlap with the source/drain region 230 in the third direction D3. Although the boundary between the first section SP1 and the second section SP2 is not clearly distinguished, the boundary may be defined to overlap with a line vertically extending along the side surfaces of the second to fourth channels CH2 to CH4.

The first spacer 181 may be formed at each of opposite side portions of the gate line 220 between the first channel CH1 and the second channel CH2. Two first spacers 181 separate from each other may be disposed at opposite side portions of one gate line 220, respectively. The two first spacers 181 disposed at the opposite side portions of one gate line 220 do not physically contact each other.

The first section SP1 may be disposed adjacent to an outside of the gate insulating film. The second section SP2 may be formed between the first epitaxial region EP1 and the second epitaxial region EP2. One side portion of the first section SP1 may contact the gate insulating film, and the other side portion of the first section SP1 may contact the second section SP2.

The second section SP2 may be disposed on the second epitaxial region EP2 adjacent to an edge of the second epitaxial region EP2. In some embodiments, one side portion of the second section SP2 may contact the first section SP1 and the first channel CH1, and the other side portion of the second section SP2 may contact the first epitaxial region EP1 and the second epitaxial region EP2. In some embodiments, a top surface of the second section SP2 may contact the first epitaxial region EP1, and a bottom surface of the second section SP2 may contact the second epitaxial region EP2. The second section SP2 may overlap with the first channel CH1 in the first direction D1 (horizontal direction). In some embodiments, the thickness of the second section SP2 may be greater than the thickness of the first section SP1.

In some embodiments, the second spacer 182 and the third spacer 183 may not overlap with the source/drain region 230 in the third direction D3.

In some embodiments, the first spacer 181, the second spacer 182, and the third spacer 183 may include the same material. In some embodiments, the first section SP1 and the second section SP2 of the first spacer 181 may include the same material. The first spacer 181, the second spacer 182, and the third spacer 183 may include an insulating material. For example, the first spacer 181, the second spacer 182, and the third spacer 183 may include SiN, SiON, SiCON, or a combination thereof.

The fourth spacer 157 and the fifth spacer 158 may include an insulating material. The fourth spacer 157 and the fifth spacer 158 may include SiN, SiON, SiCON, or a combination thereof.

A gate capping layer 155 may be disposed on the gate metal layer. Although not clearly shown, a via may be formed at the gate capping layer 155 in order to connect the gate metal layer to a structure thereover. In some embodiments, the gate capping layer 155 may be omitted.

It may be possible to minimize or reduce leakage of current between adjacent ones of the source/drain regions 230 (for example, through the first channel CH1) by forming the second epitaxial region EP2 such that the second epitaxial region EP2 contacts a portion of the first channel CH1 disposed at a lowermost end of the channel active regions 111 and 112, and disposing the second section SP2 of the first spacer 181 between the first channel CH1 and the source/drain region 230.

Hereinafter, a method for manufacturing a semiconductor integrated circuit device will be described. The following description will be given mainly in conjunction with a procedure for manufacturing a first spacer 181 and a procedure for manufacturing a source/drain region 230.

FIGS. 5 to 12 are views schematically showing procedures of a method for manufacturing a semiconductor integrated circuit device in accordance with example embodiments of the disclosure, respectively.

Figure 5:
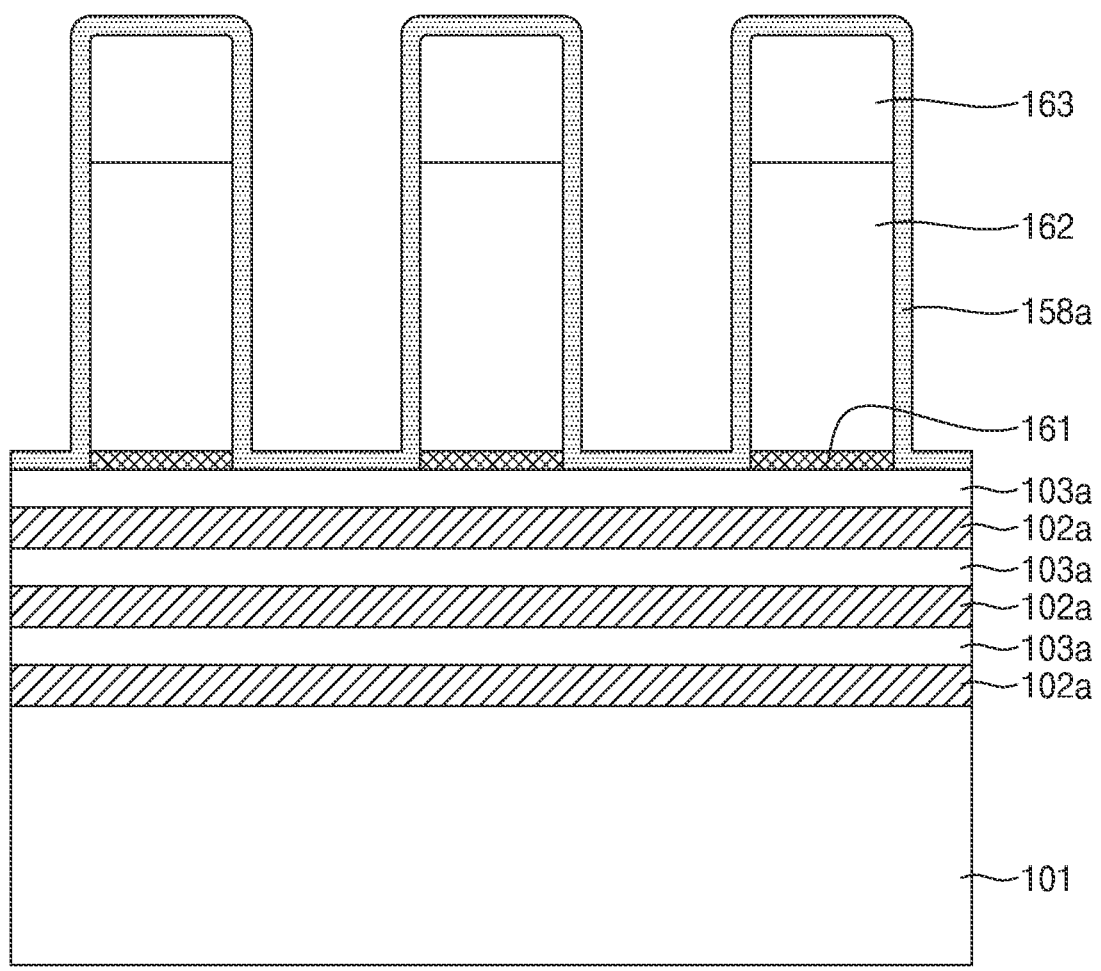
FIGS. 5 to 12 are views schematically showing procedures of a method for manufacturing a semiconductor integrated circuit device in accordance with example embodiments of the disclosure, respectively.

Referring to operation S110 of FIG. 5, a substrate sacrificial material 102a and a substrate material 103a may be alternately stacked on a base substrate material 101. The base substrate material 101 and the substrate material 103a may include the same material as the above-described substrate 101. For example, the base substrate material 101 and the substrate material 103a may include Si. For example, the substrate sacrificial material 102a may include SiGe.

Thereafter, an insulating pattern 161 may be formed on a structure in which the substrate sacrificial material 102a and the substrate material 103a are alternately stacked, and a plurality of vertical pattern structures, in which a gate sacrificial pattern 162 and a hard mask pattern 163 are stacked, may be formed on the insulating pattern 161.

Subsequently, an outer spacer material 158a covering or overlapping the plurality of vertical pattern structures may be formed. The outer spacer material 158a may include the same material as a fifth spacer 158.

Figure 6:
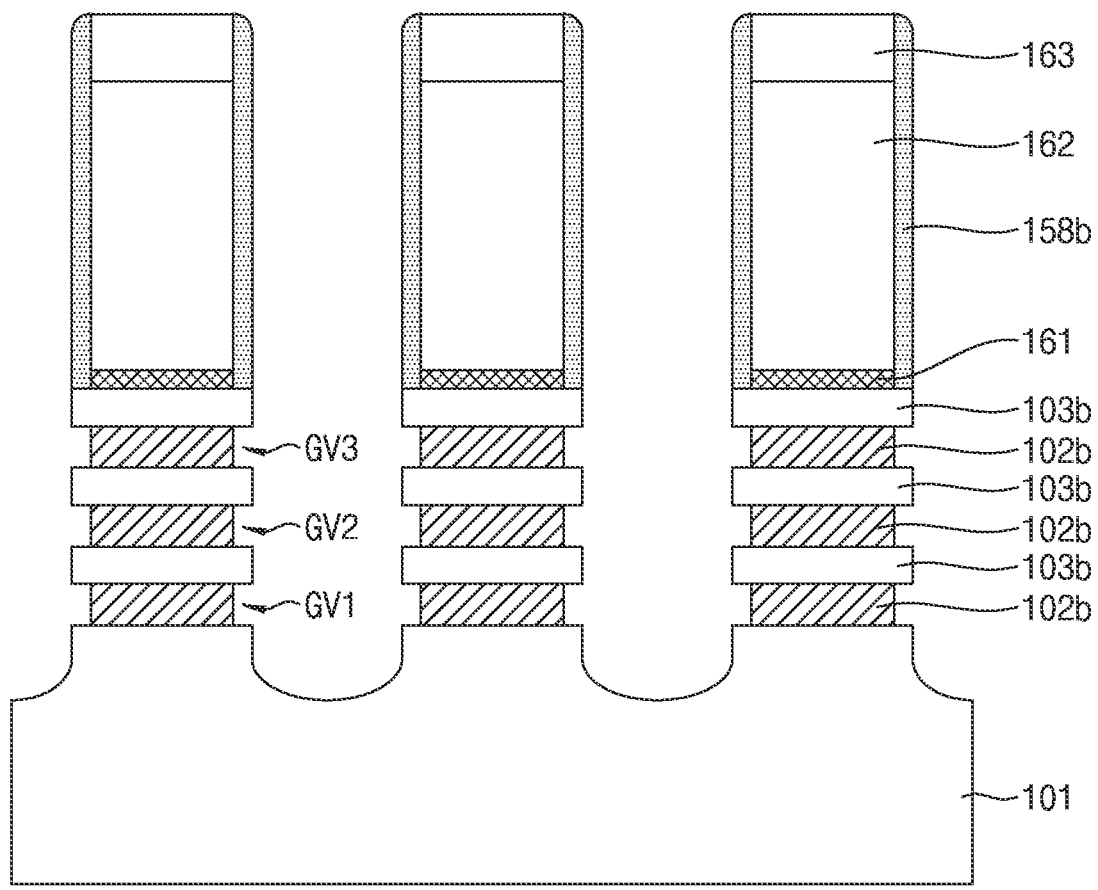

Next, referring to operation S120 of FIG. 6, portions, among the plurality of vertical pattern structures, of the base substrate material 101 and the structure, in which the substrate sacrificial material 102a and the substrate material 103a are alternately stacked, may be removed through a wet etching process. The removed portions may have a predetermined depth. Vertical grooves may be formed by the removed portions. A side portion of the substrate sacrificial material 102a may be exposed at each vertical groove.

A portion of an edge of the substrate sacrificial material 102a may be removed in each vertical groove through an over-etching process. A part of the exposed side portion of the substrate sacrificial material 102a may be removed. As the portion of the edge of the substrate sacrificial material 102a is removed, a horizontal stepped structure may be formed between a substrate sacrificial material 102b and a substrate material 103b. Two substrate materials 103b adjacent to each other and one substrate sacrificial material 102b formed therebetween may form a groove in accordance with a stepped structure thereof and, as such, first to third grooves GV1 to GV3 may be formed.

Figure 7:
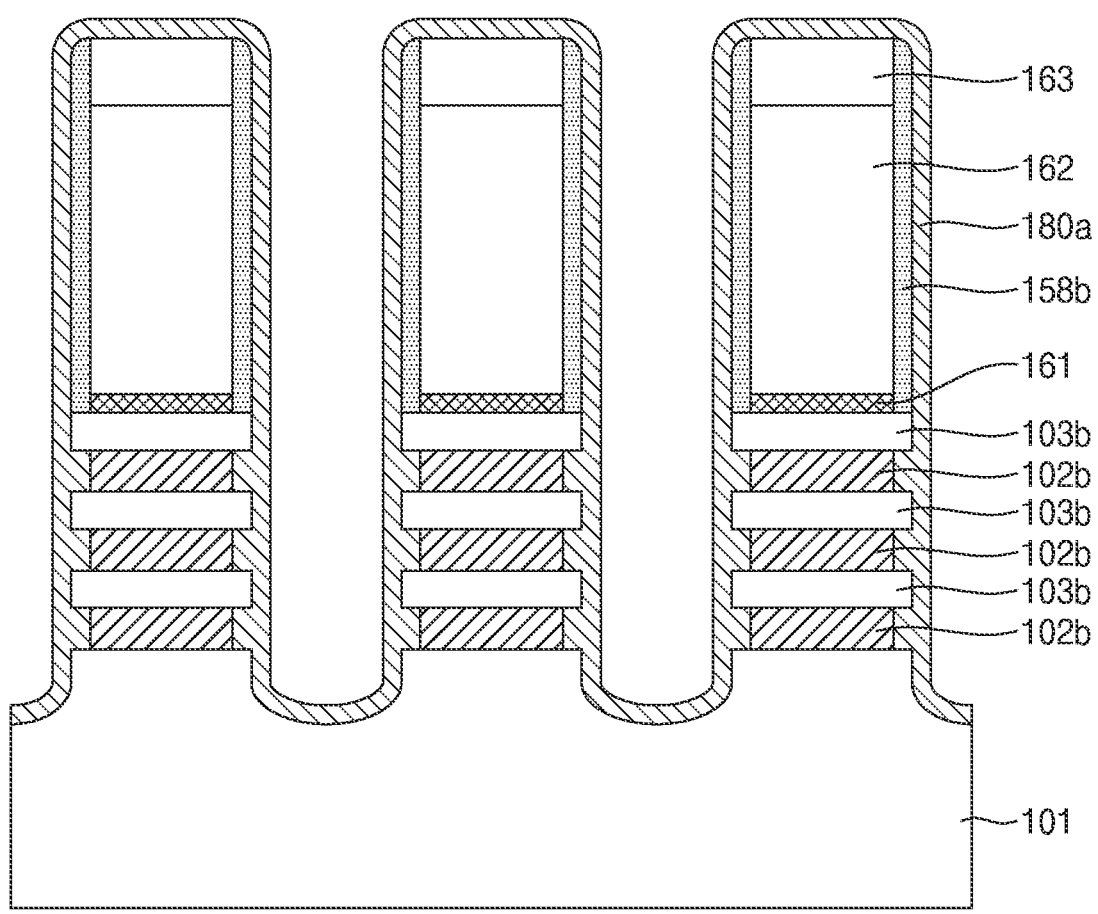

Thereafter, referring to operation S130 of FIG. 7, a first spacer material 180a may be formed to cover or overlap the vertical grooves while filling the first to third grooves GV1 to GV3 and to cover or overlap the plurality of vertical pattern structures. The first spacer material 180a may include the same material as first to third spacers 181 to 183.

Figure 8:
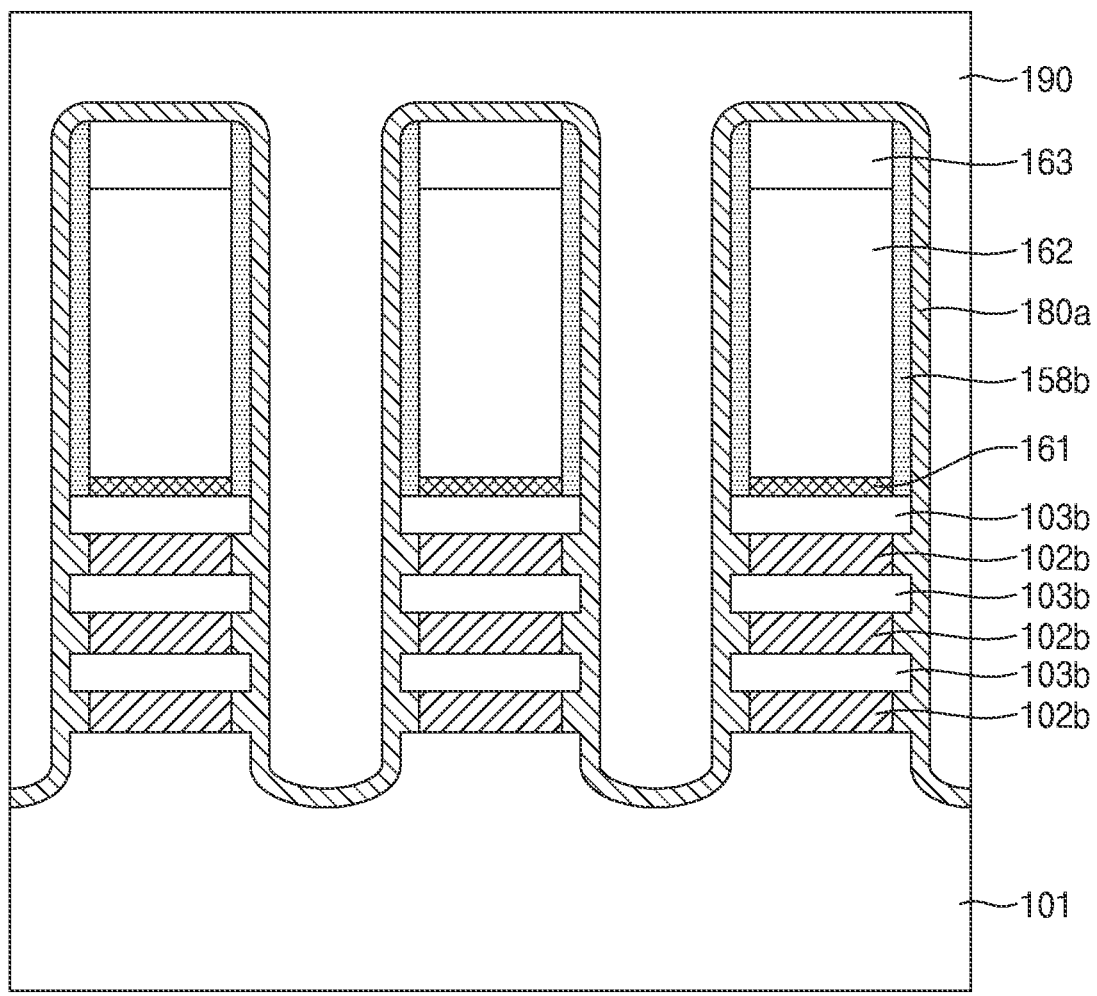

Subsequently, referring to operation S140 of FIG. 8, a coating material 190 may be formed in a region where no process will be performed from among a first element region RX1 and a second element region RX2. For example, the coating material 190 may be formed over the entire surface of the second element region RX2, for execution of a process in the first element region RX1. For example, the coating material 190 may include SOH.

Figure 9:
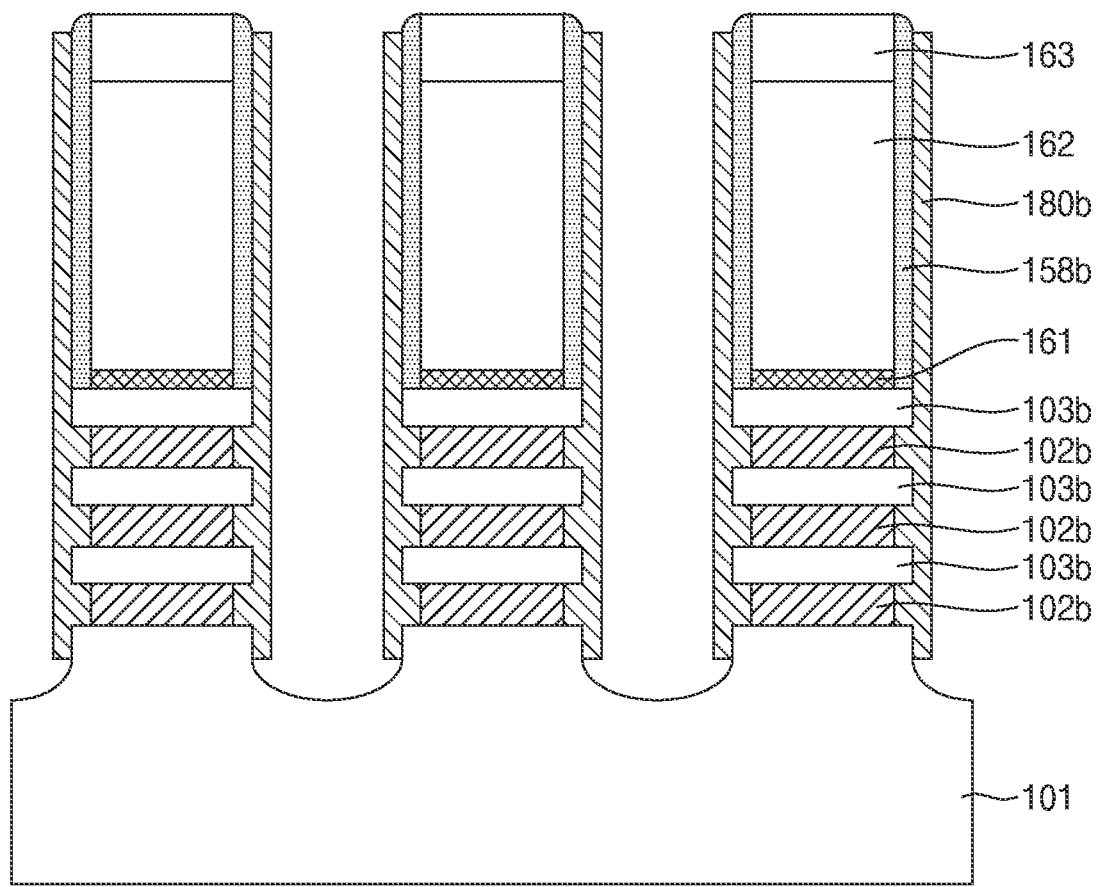

Thereafter, referring to operation S150 of FIG. 9, the coating material 190 may be removed through an etching process, and portions of the first spacer material 180a disposed on the hard mask pattern 163 and beneath the vertical grooves may be removed through an etch-back process. The partially-removed first spacer material 180a may expose a top surface of the substrate 101 and a top surface of the hard mask pattern 163. The remaining portion is denoted as first spacer material 180b.

Figure 10:
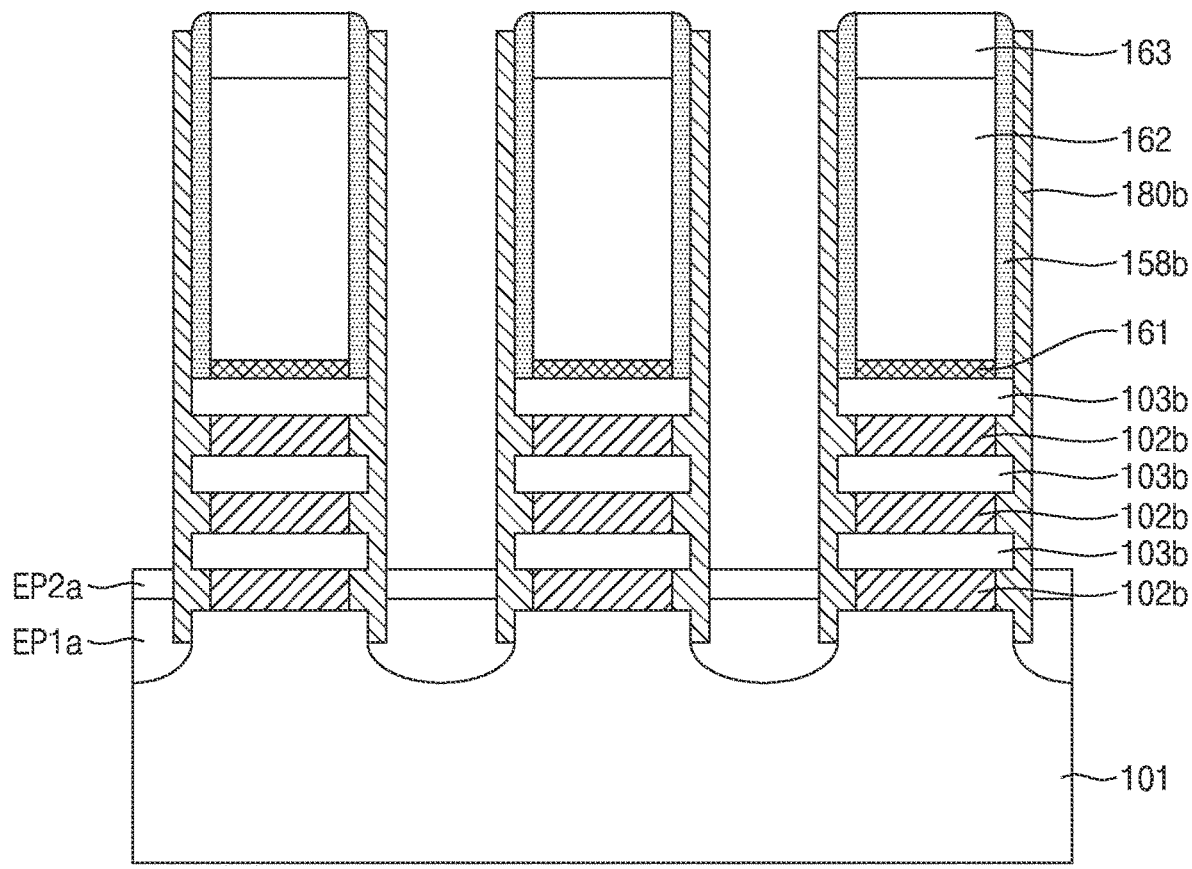

Next, referring to operation S160 of FIG. 10, a first epitaxial material EP1a and a second epitaxial material EP2a may be sequentially formed on the substrate 101 exposed in the vertical grooves. The first epitaxial material EP1a and the second epitaxial material EP2a may be formed to have predetermined heights extending from the top surface of the substrate 101 while contacting the first spacer material 180a. In some embodiments, the height of a top surface of the second epitaxial material EP2a may be equal to or lower than the height of a top surface of the substrate sacrificial material 102b directly formed on the substrate 101.

Figure 11:
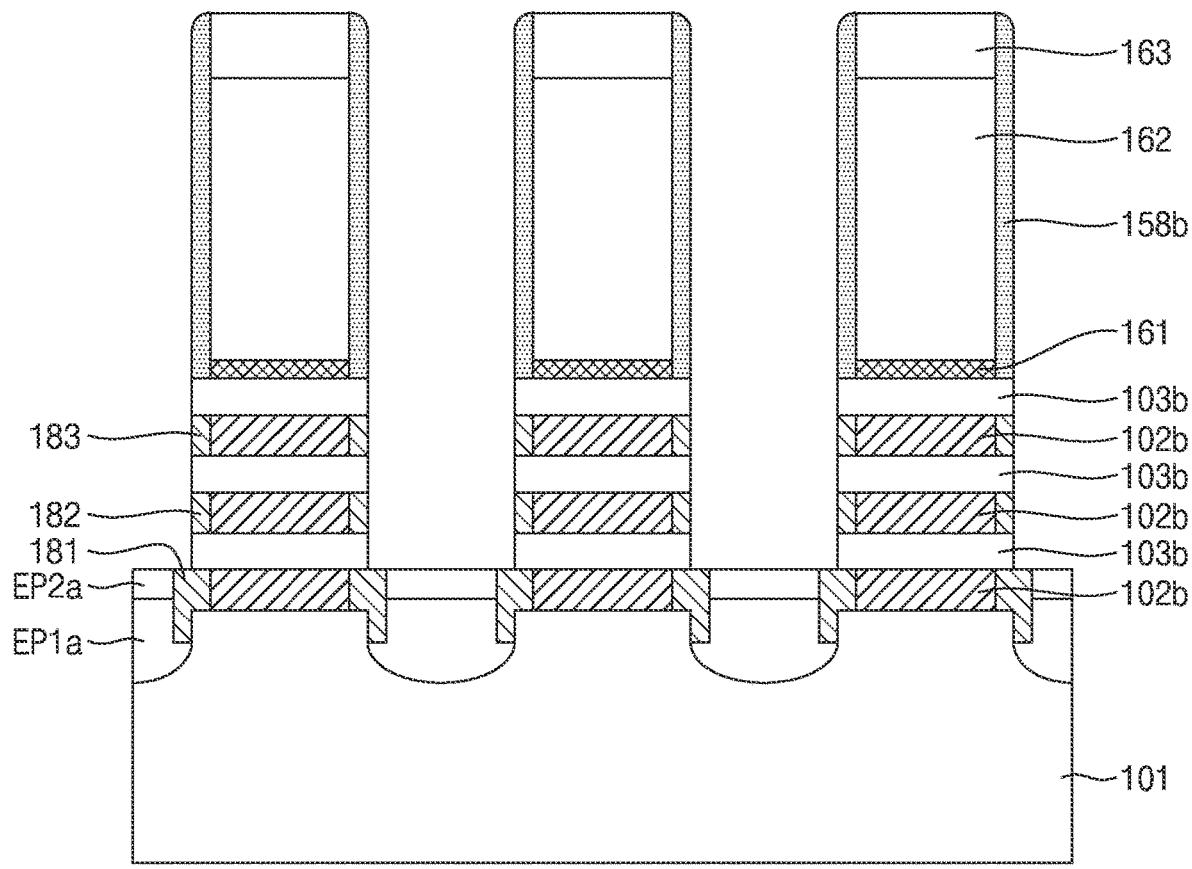

Thereafter, referring to operation S170 of FIG. 11, a portion of the first spacer material 180a may be removed through a stripping process. The first spacer material 180a may be removed, except for a portion thereof contacting the first epitaxial material EP1a and the second epitaxial material EP2a and a portion thereof formed in a first groove GV1. As the first spacer material 180a is partially removed, the first spacer material 180a may become first to third spacers 181 to 183 separate from one another.

Figure 12:
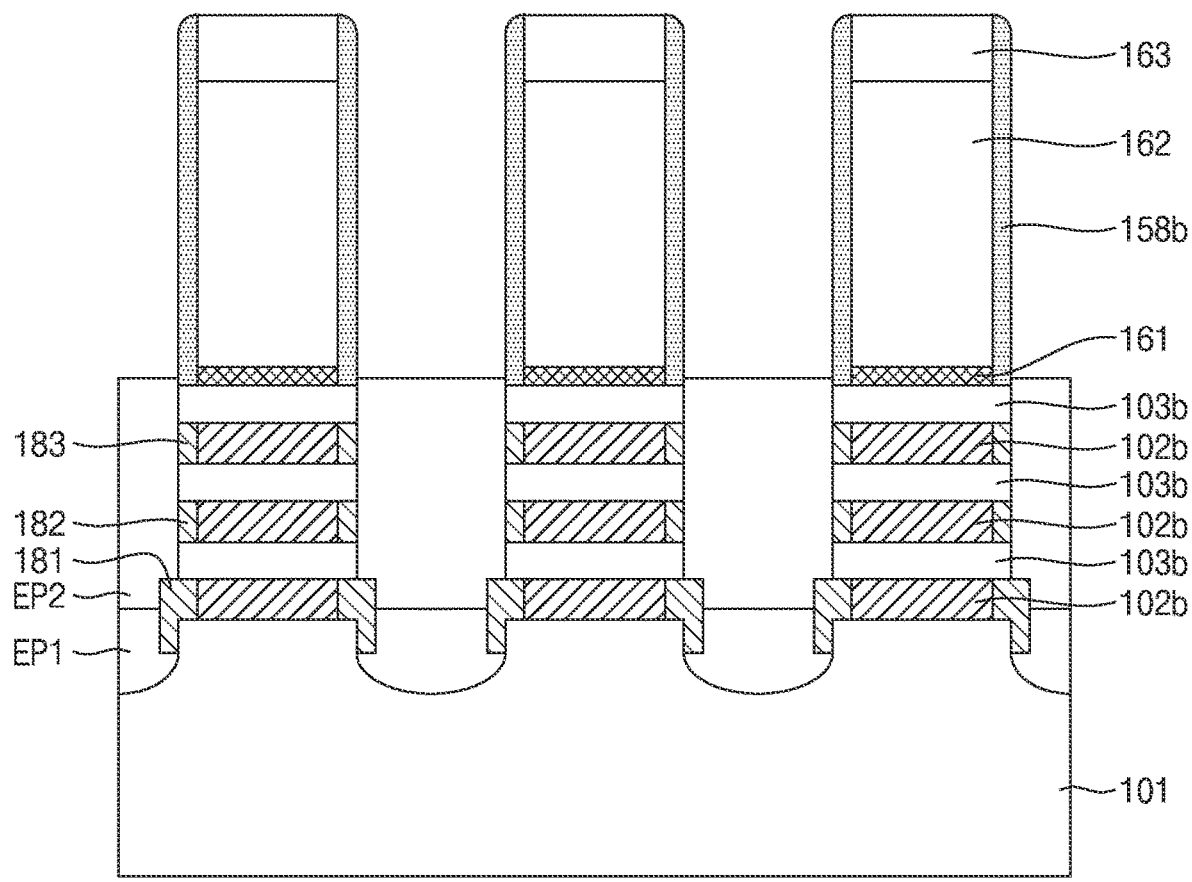

Subsequently, referring to operation S180 of FIG. 12, a process for growing the first epitaxial material EP1a or the second epitaxial material EP2a may be performed. For example, the first epitaxial material EP1a may be grown such that the height of a top surface of the first epitaxial material EP1a becomes equal to or higher than the heights of top surfaces of the substrate sacrificial material 102b and the substrate material 103b, which are disposed at uppermost sides. The grown first epitaxial material EP1a and the second epitaxial material EP2a may become a source/drain region 230. The grown first epitaxial material EP1a and the second epitaxial material EP2a may become a first epitaxial region EP1 and a second epitaxial region EP2 of the source/drain region 230, respectively.

Although not clearly shown, a gate line 220 may then be formed in a region where the substrate sacrificial material 102b, the gate sacrificial pattern 162 and the hard mask pattern 163 are formed, through removal or replacement of the substrate sacrificial material 102b, the gate sacrificial pattern 162 and the hard mask pattern 163.

Next, a semiconductor integrated circuit device according to example embodiments of the disclosure and a manufacturing method thereof will be described. In the following description, description will not necessarily be repeated of the same constituent elements as those of FIGS. 1 to 12, and the same or similar reference numerals will be used for these constituent elements.

Figure 13:
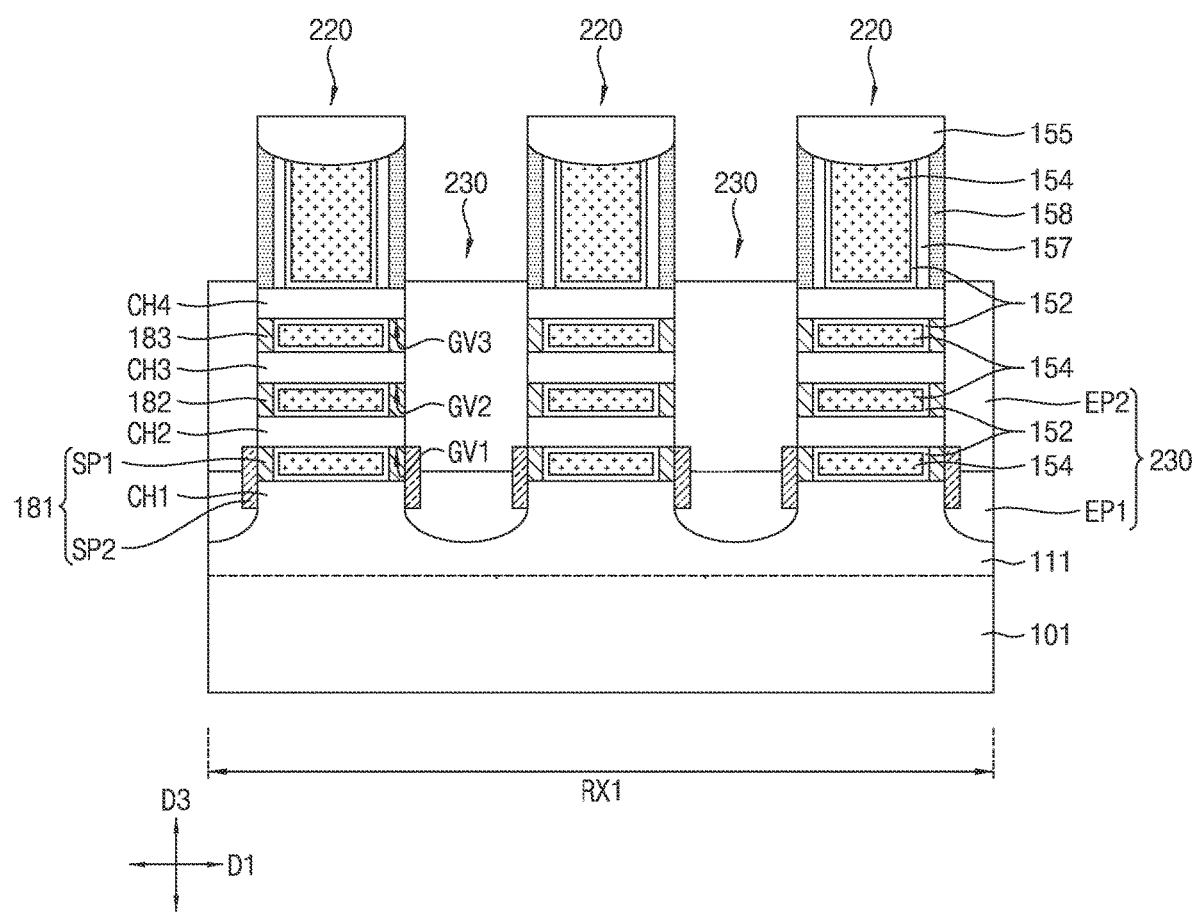
FIG. 13 is a schematic cross-sectional view of a semiconductor integrated circuit device according to example embodiments of the disclosure.

FIG. 13 is a schematic cross-sectional view of a semiconductor integrated circuit device according to example embodiments of the disclosure.

Referring to FIG. 13, the semiconductor integrated circuit device according to some embodiments differs from the semiconductor integrated circuit device according to FIG. 2 in that a first section SP1 and a second section SP2 of a first spacer 181 include different materials, respectively.

In some embodiments, the first section SP1 and the second section SP2 of the first spacer 181 may include different materials, respectively. The first section SP1 and the second section SP2 may be clearly distinguished from each other. For example, the first section SP1 may include one of SiN, SiON or SiCON, and the second section SP2 may include another one of SiN, SiON or SiCON. For example, the first section SP1 and the second section SP2 may be separate spacers including different materials, respectively.

In some embodiments, the second section SP2 of the first spacer 181 may include a material different from those of the first section SP1 of the first spacer 181, a second spacer 182 and a third spacer 183. For example, the first section SP1 of the first spacer 181, the second spacer 182 and the third spacer 183 may include the same material.

FIGS. 14 to 23 are views schematically showing procedures of a method for manufacturing the semiconductor integrated circuit device according to embodiments of FIG. 13, respectively.

Figure 14:
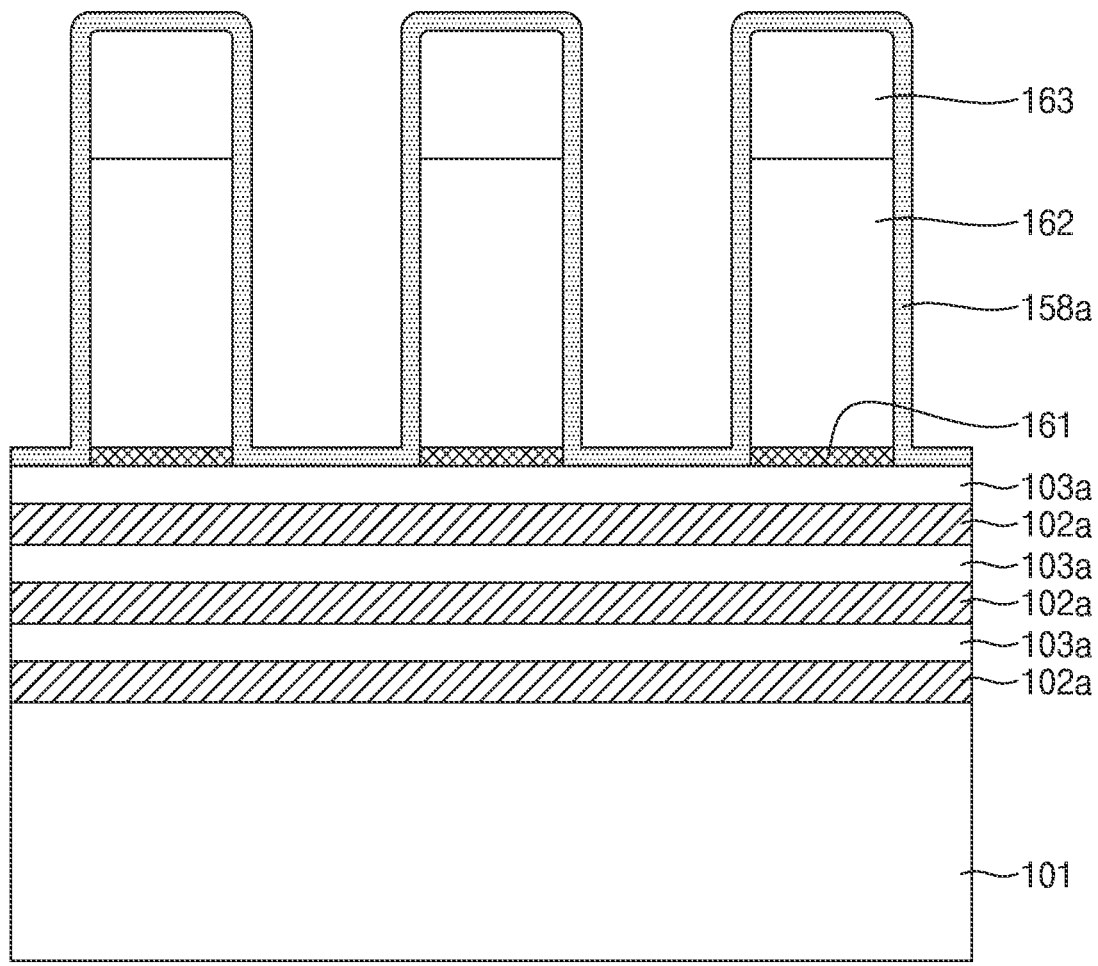
FIGS. 14 to 23 are views schematically showing procedures of a method for manufacturing the semiconductor integrated circuit device of FIG. 13.

Referring to operation S210 of FIG. 14, a substrate sacrificial material 102a and a substrate material 103a may be alternately stacked on a base substrate material 101. The base substrate material 101 and the substrate material 103a may include the same material as the above-described substrate 101. For example, the base substrate material 101 and the substrate material 103a may include Si. For example, the substrate sacrificial material 102a may include SiGe.

Thereafter, an insulating pattern 161 may be formed on a structure in which the substrate sacrificial material 102a and the substrate material 103a are alternately stacked, and a plurality of vertical pattern structures, in which a gate sacrificial pattern 162 and a hard mask pattern 163 are stacked, may be formed on the insulating pattern 161.

Subsequently, an outer spacer material 158a covering or overlapping the plurality of vertical pattern structures may be formed. The outer spacer material 158a may include the same material as a fifth spacer 158.

Figure 15:
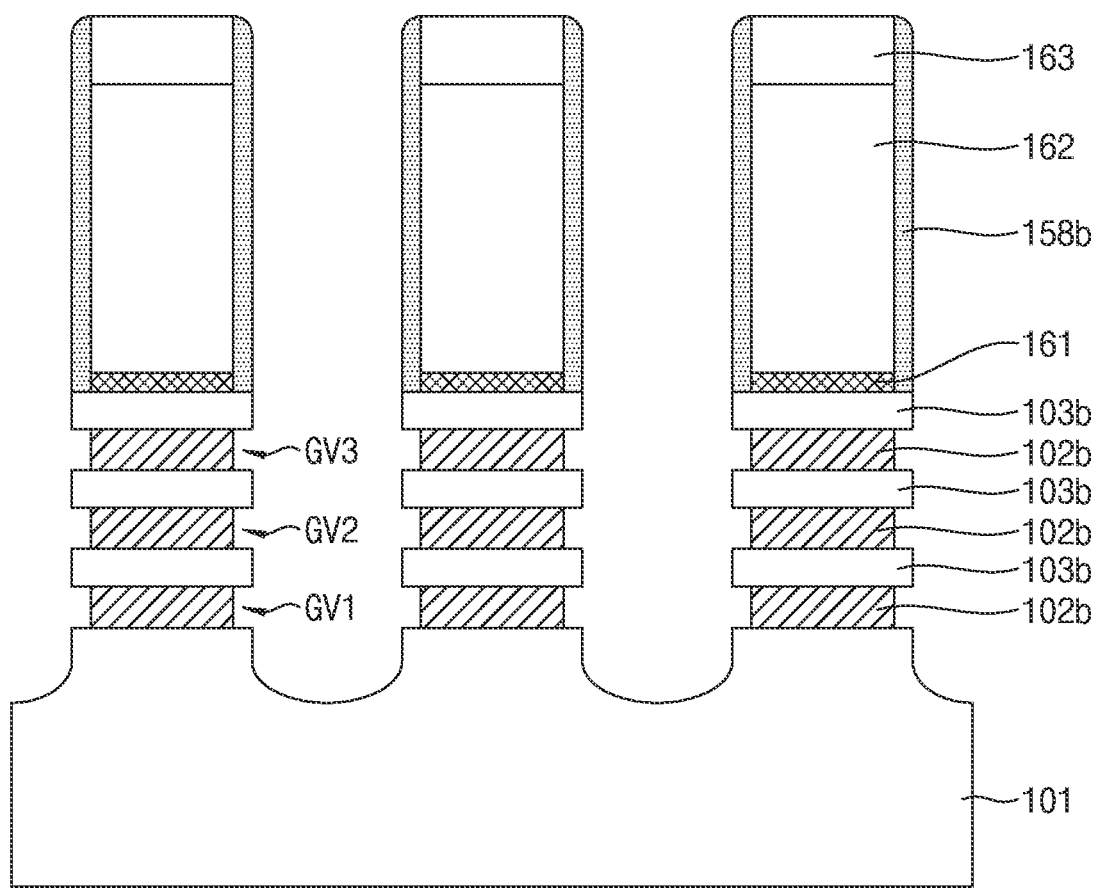

Next, referring to operation S220 of FIG. 15, portions, among the plurality of vertical pattern structures, of the base substrate material 101 and the structure, in which the substrate sacrificial material 102a and the substrate material 103a are alternately stacked, may be removed through a wet etching process. The removed portions may have a predetermined depth. Vertical grooves may be formed by the removed portions. A side portion of the substrate sacrificial material 102a may be exposed at each vertical groove.

A portion of an edge of the substrate sacrificial material 102a may be removed in each vertical groove through an over-etching process. A part of the exposed side portion of the substrate sacrificial material 102a may be removed. As the portion of the edge of the substrate sacrificial material 102a is removed, a horizontal stepped structure may be formed between a substrate sacrificial material 102b and a substrate material 103b. Two substrate materials 103b adjacent to each other and one substrate sacrificial material 102b formed therebetween may form a groove in accordance with a stepped structure thereof and, as such, first to third grooves GV1 to GV3 may be formed.

Figure 16:
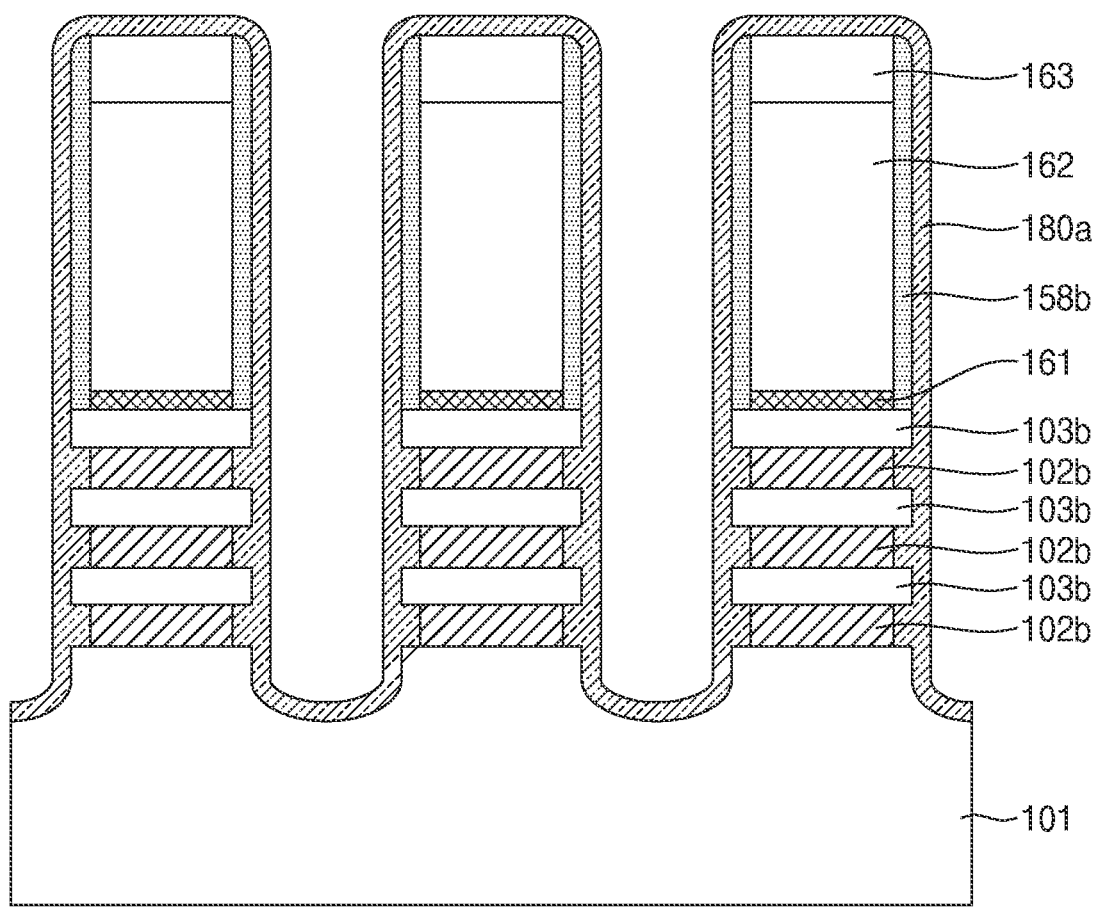

Thereafter, referring to operation S230 of FIG. 16, a first spacer material 180a may be formed to cover or overlap the vertical grooves while filling the first to third grooves GV1 to GV3 and to cover or overlap the plurality of vertical pattern structures. The first spacer material 180a may include the same material as the first section SP1 of the first spacer 181, the second spacer 182 and the third spacer 183.

Figure 17:
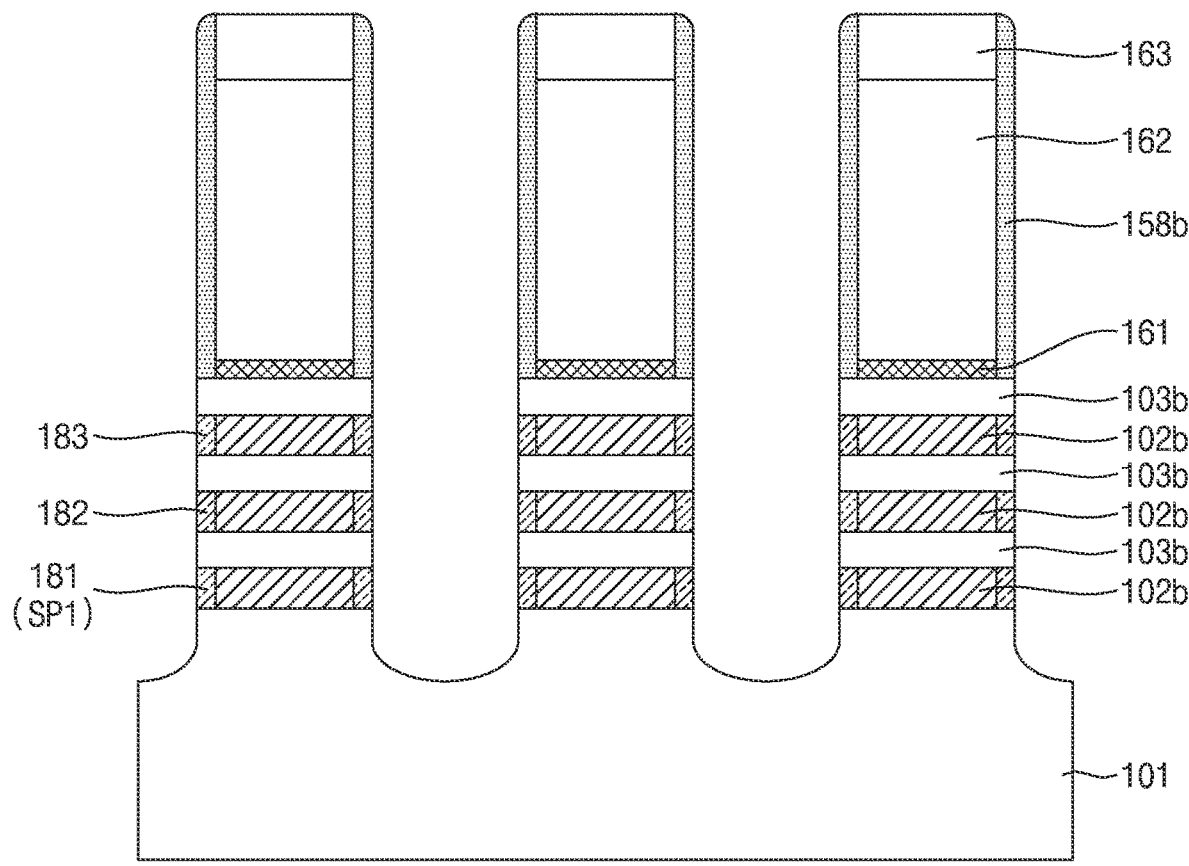

Thereafter, referring to operation S231 of FIG. 17, a portion of the first spacer material 180a may be removed through a stripping process. The first spacer material 180a may be removed, except for a portion thereof contacting the first epitaxial material EP1a and the second epitaxial material EP2a and a portion thereof formed in the first groove GV1. As the first spacer material 180a is partially removed, the first spacer material 180a may become the first section SP1 of the first spacer 181, the second spacer 182 and the third spacer 183 separate from one another.

Figure 18:
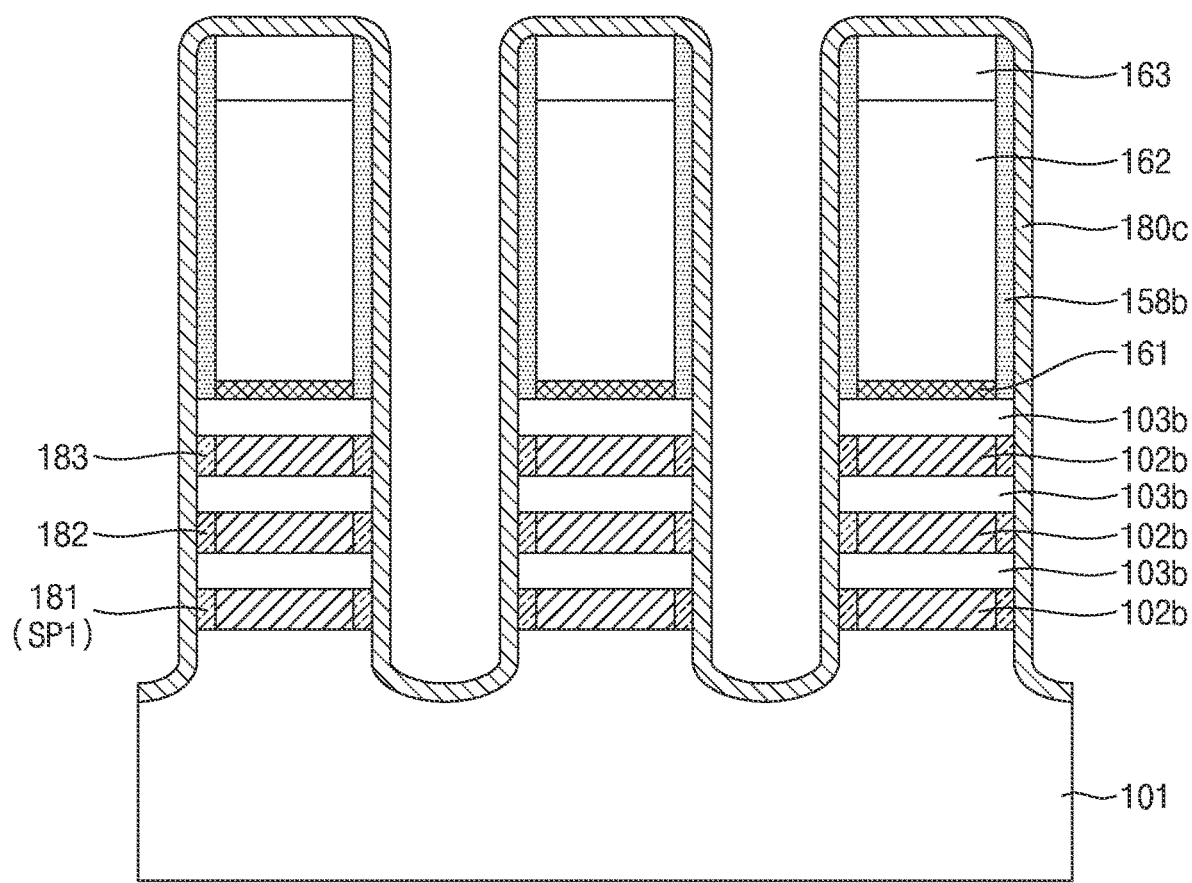

Subsequently, referring to operation S232 of FIG. 18, a second spacer material 180c may be formed to cover or overlap the plurality of vertical pattern structures and the first spacer material 180a. The second spacer material 180c may include the same material as the second section SP2 of the first spacer 181.

Figure 19:
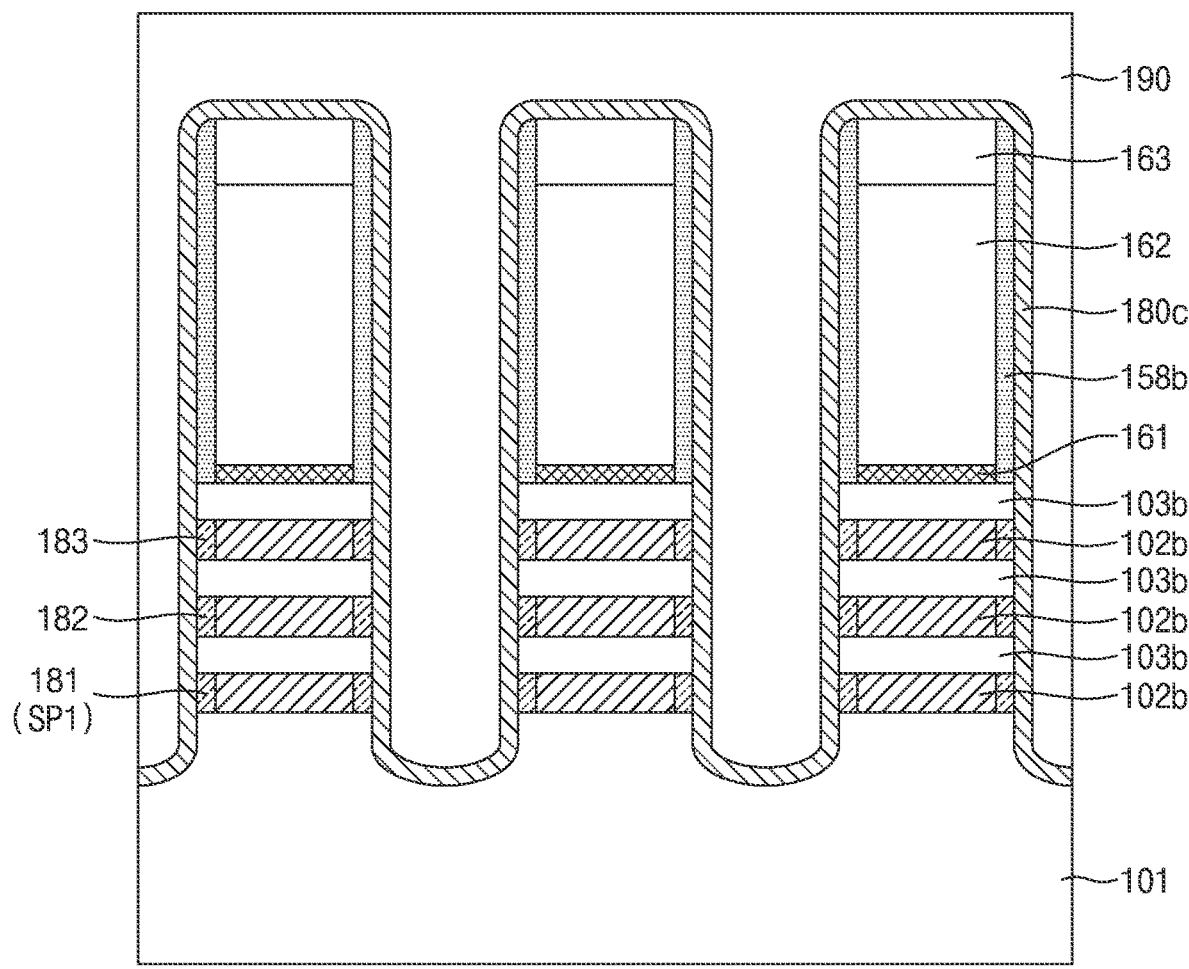

Next, referring to operation S240 of FIG. 19, a coating material 190 may be formed in a region where no process will be performed from among a first element region RX1 and a second element region RX2. For example, the coating material 190 may be formed over the entire surface of the second element region RX2, for execution of a process in the first element region RX1. For example, the coating material 190 may include SOH.

Figure 20:
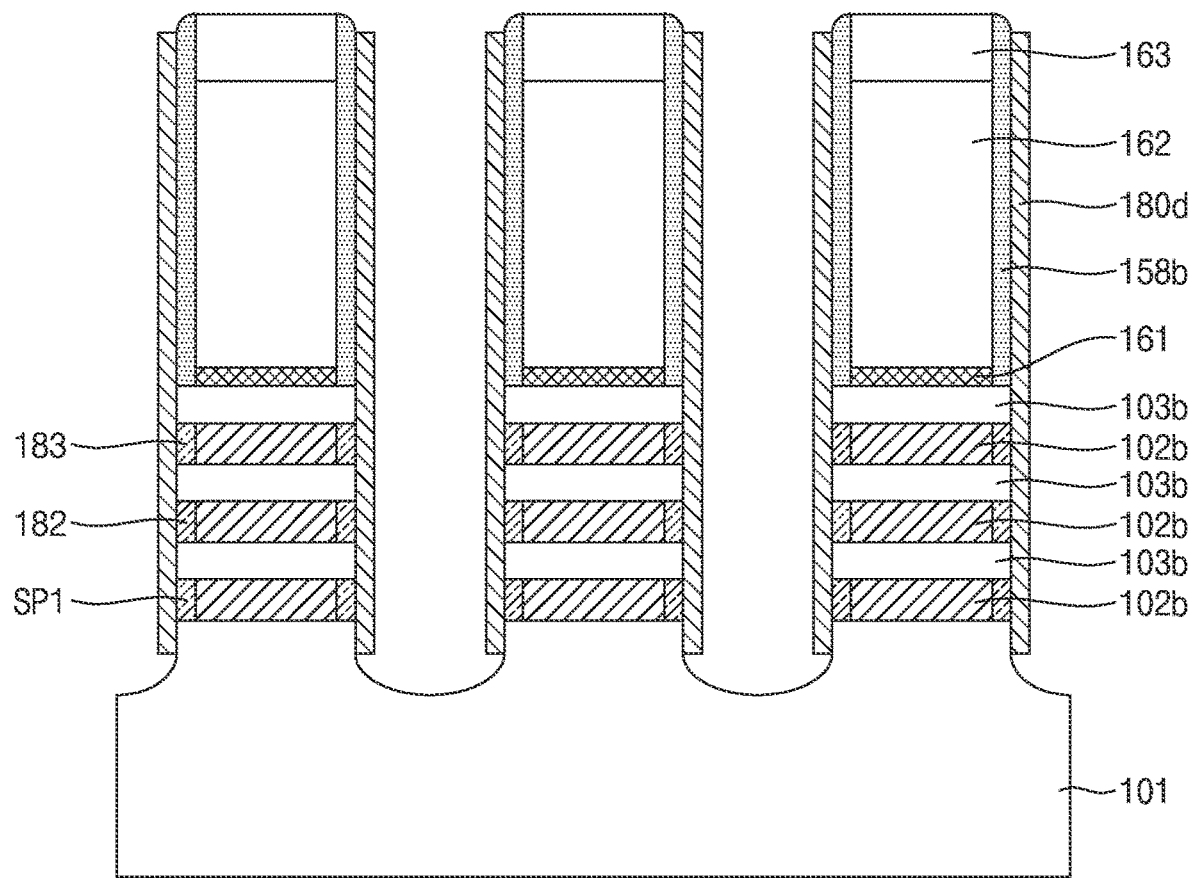

Thereafter, referring to operation S250 of FIG. 20, the coating material 190 may be removed through an etching process, and portions of the second spacer material 180c disposed on the hard mask pattern 163 and beneath the vertical grooves may be removed through an etch-back process. The partially-removed second spacer material 180c may expose a top surface of the substrate 101 and a top surface of the hard mask pattern 163. The remaining portion is denoted as second spacer material 180d.

Figure 21:
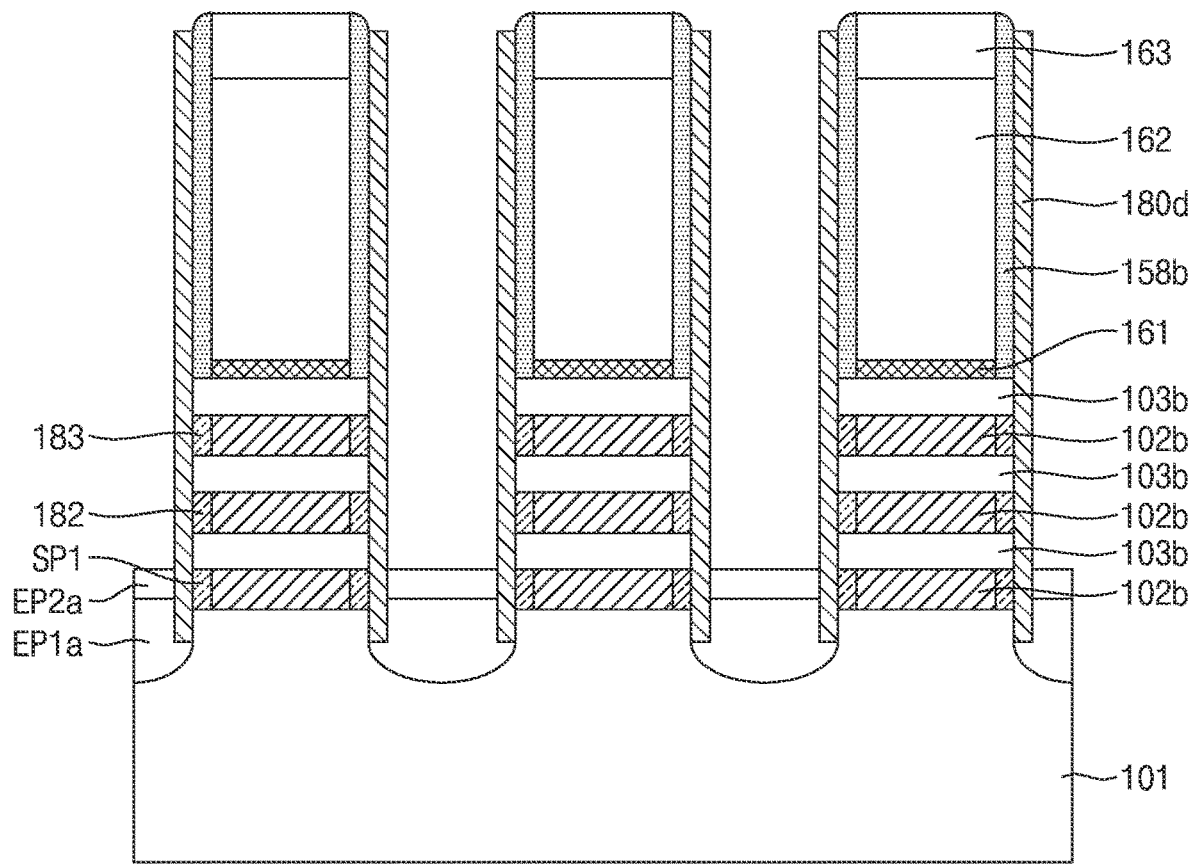

Next, referring to operation S260 of FIG. 21, a first epitaxial material EP1a and a second epitaxial material EP2a may be sequentially formed on the substrate 101 exposed in the vertical grooves. The first epitaxial material EP1a and the second epitaxial material EP2a may be formed to have predetermined heights extending from the top surface of the substrate 101 while contacting the remaining portion of second spacer material 180d. In some embodiments, the height of a top surface of the second epitaxial material EP2a may be equal to or lower than the height of a top surface of the substrate sacrificial material 102b directly formed on the substrate 101.

Figure 22:
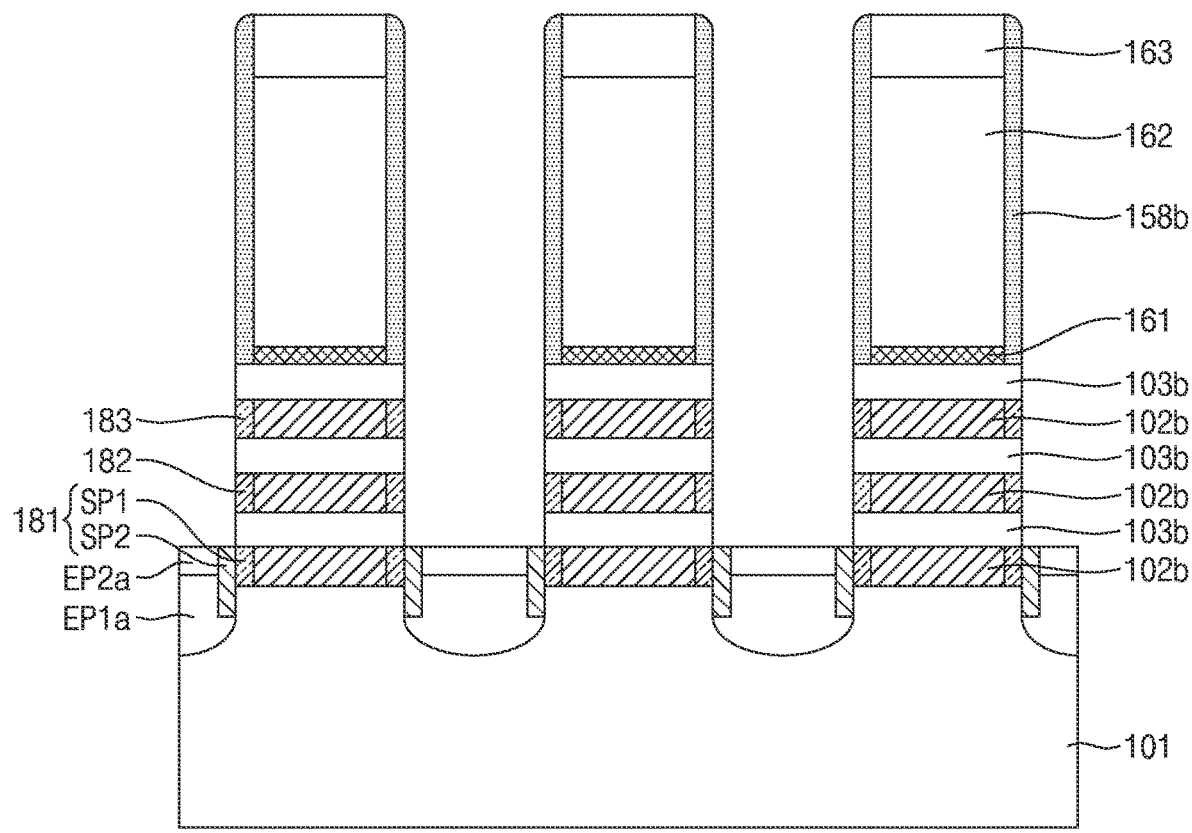

Thereafter, referring to operation S270 of FIG. 22, a portion of the second spacer material 180c may be removed through a stripping process. The second spacer material 180c may be removed, except for a portion thereof contacting the first epitaxial material EP1a and the second epitaxial material EP2a and a portion thereof contacting the first spacer material 180a. As the second spacer material 180c is partially removed, the second spacer material 180c may become the second section SP2 of the first spacer 181.

Figure 23:
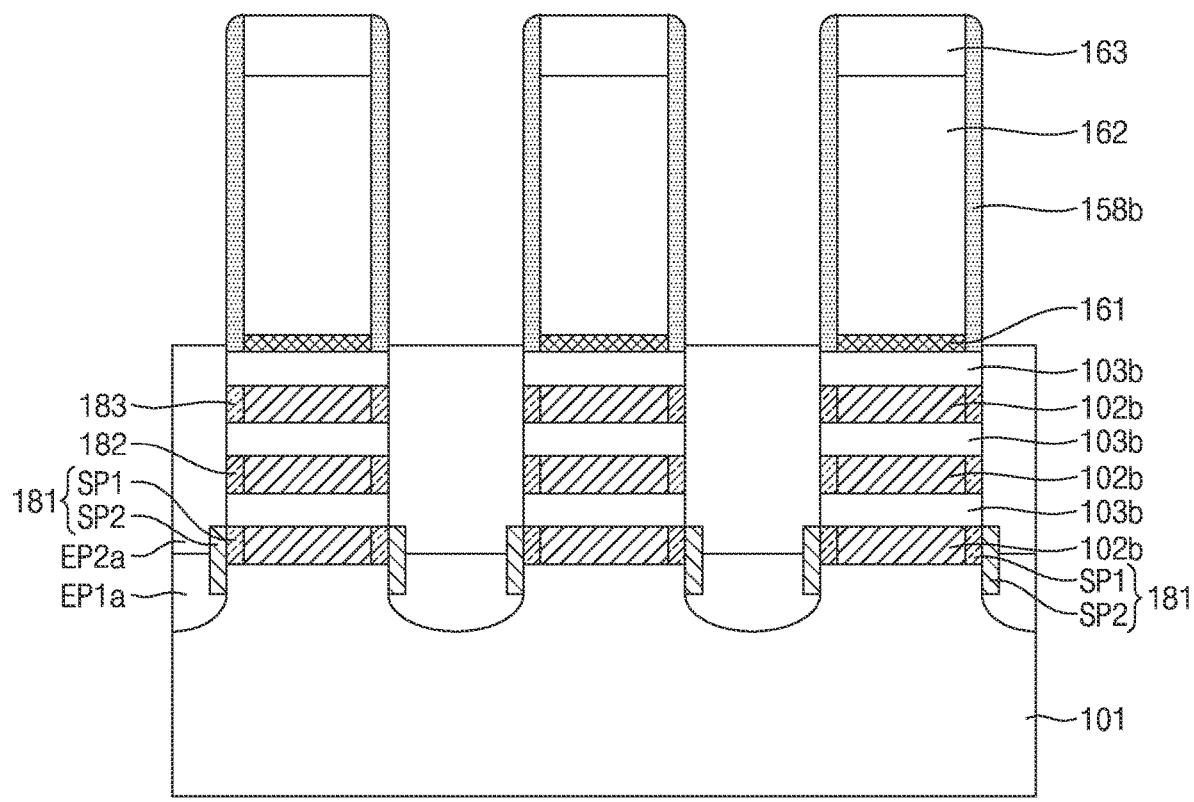

Subsequently, referring to operation S280 of FIG. 23, a process for growing the first epitaxial material EP1a or the second epitaxial material EP2a may be performed. For example, the first epitaxial material EP1a may be grown such that the height of a top surface of the first epitaxial material EP1a becomes equal to or higher than the heights of top surfaces of the substrate sacrificial material 102b and the substrate material 103b, which are disposed at uppermost sides. The grown first epitaxial material EP1a and the second epitaxial material EP2a may become a source/drain region 230. The grown first epitaxial material EP1a and the second epitaxial material EP2a may become a first epitaxial region EP1 and a second epitaxial region EP2 of the source/drain region 230, respectively.

Although not clearly shown, a gate line 220 may then be formed in a region where the substrate sacrificial material 102b, the gate sacrificial pattern 162 and the hard mask pattern 163 are formed, through removal or replacement of the substrate sacrificial material 102b, the gate sacrificial pattern 162 and the hard mask pattern 163.

Figure 24:
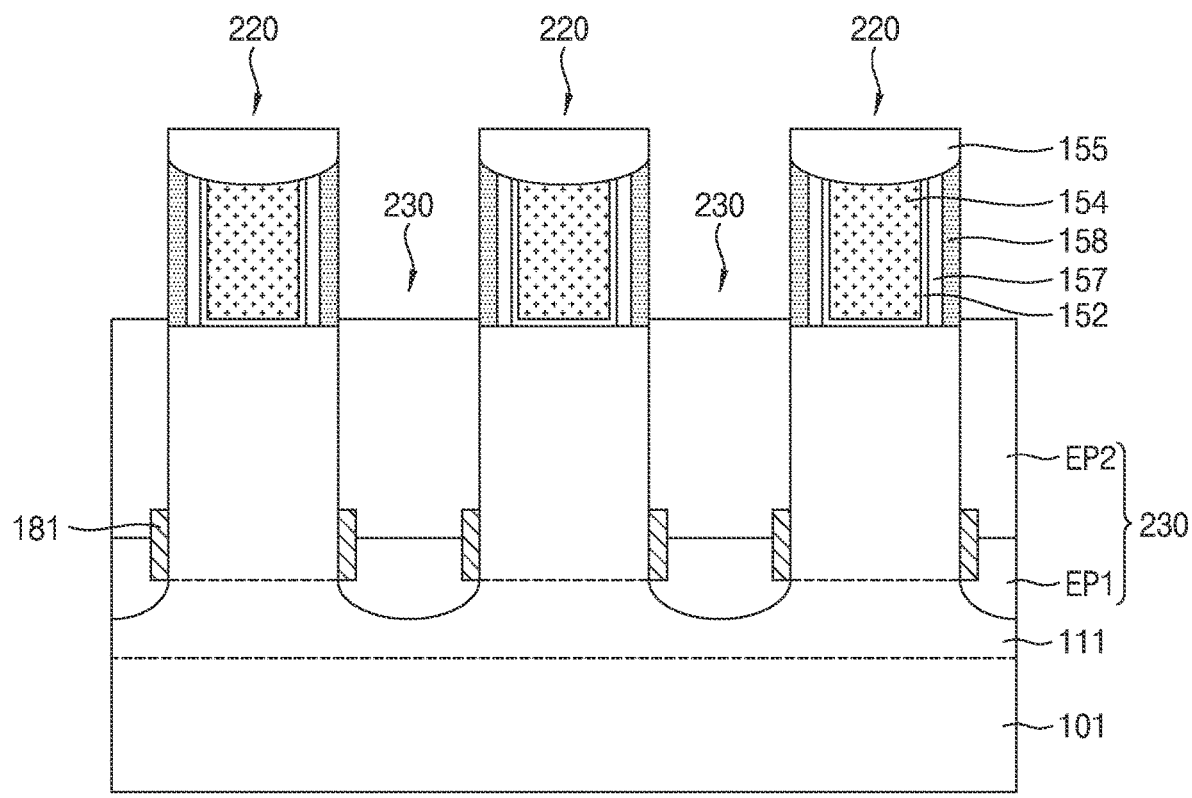
FIG. 24 is a schematic cross-sectional view of a semiconductor integrated circuit device according to example embodiments of the disclosure.

FIG. 24 is a schematic cross-sectional view of a semiconductor integrated circuit device according to example embodiments of the disclosure.

Referring to FIG. 24, the semiconductor integrated circuit device according to some embodiments differs from the semiconductor integrated circuit device according to the embodiments of FIG. 2 in that a plurality of channel active regions 111 and 112 is of a fin type or a planar type. For example, each channel active region may include a single channel. In addition, second to fourth channels CH2 to CH4 may be omitted. Furthermore, a portion of a first spacer 181, a second spacer 182, and a third spacer 183 may be omitted.

In some embodiments, the first spacer 181 may be formed at opposite sides of the plurality of channel active regions 111 and 112. The first spacer 181 may be formed on a first epitaxial region EP1. The first spacer 181 may overlap with the first epitaxial region EP1 and a second epitaxial region EP2 in a third direction D3, and may overlap with the channel active region in a first direction D1.

In some embodiments, a gate line 220 may be formed on the plurality of channel active regions 111 and 112.

FIGS. 25 to 32 are views schematically showing procedures of a method for manufacturing the semiconductor integrated circuit device according to some embodiments of FIG. 24, respectively.

Figure 25:
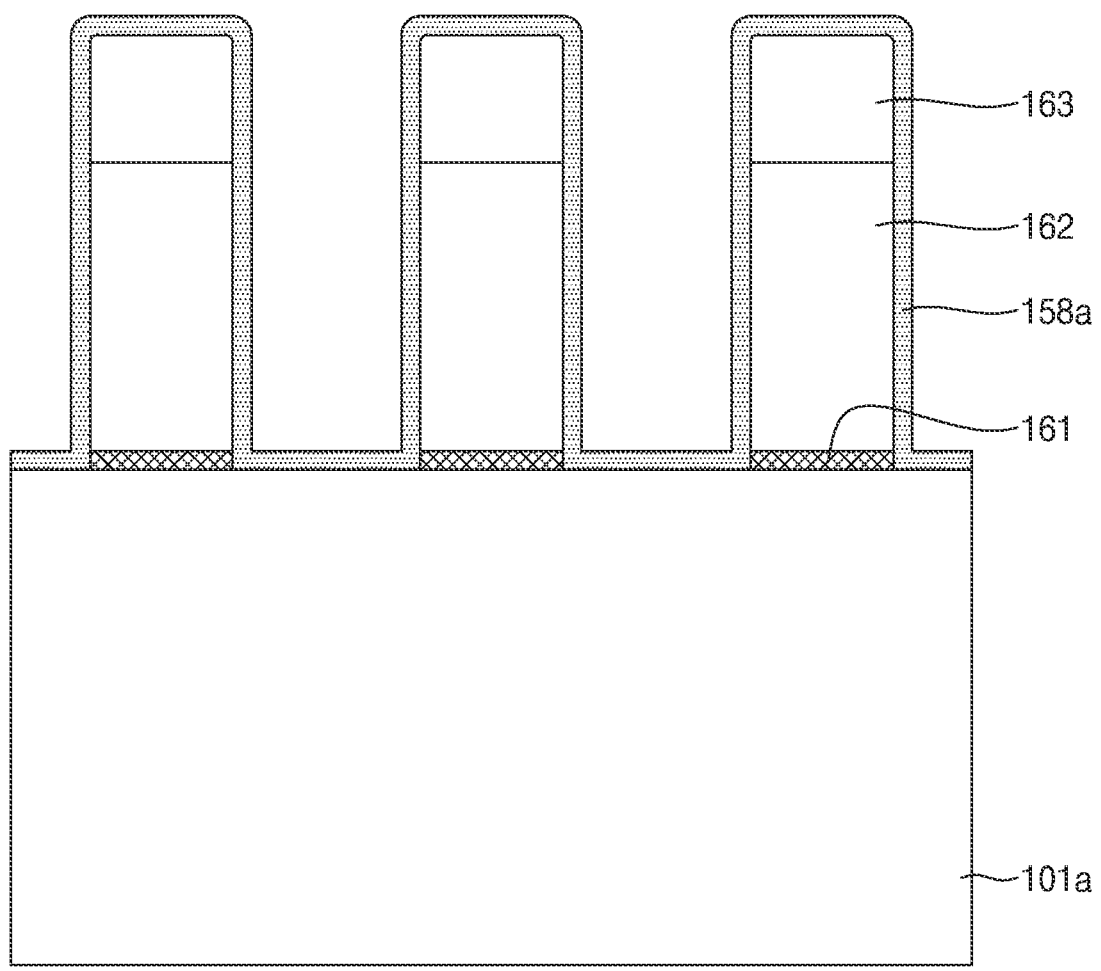
FIGS. 25 to 32 are views schematically showing procedures of a method for manufacturing the semiconductor integrated circuit device of FIG. 24.

Referring to operation S310 of FIG. 25, an insulating pattern 161 may be formed on a base substrate material 101a, and a plurality of vertical pattern structures, in which a gate sacrificial pattern 162 and a hard mask pattern 163 are stacked, may be formed on the insulating pattern 161. For example, the base substrate material 101a may include Si.

Subsequently, an outer spacer material 158a covering or overlapping the plurality of vertical pattern structures may be formed. The outer spacer material 158a may include the same material as a fifth spacer 158.

Figure 26:
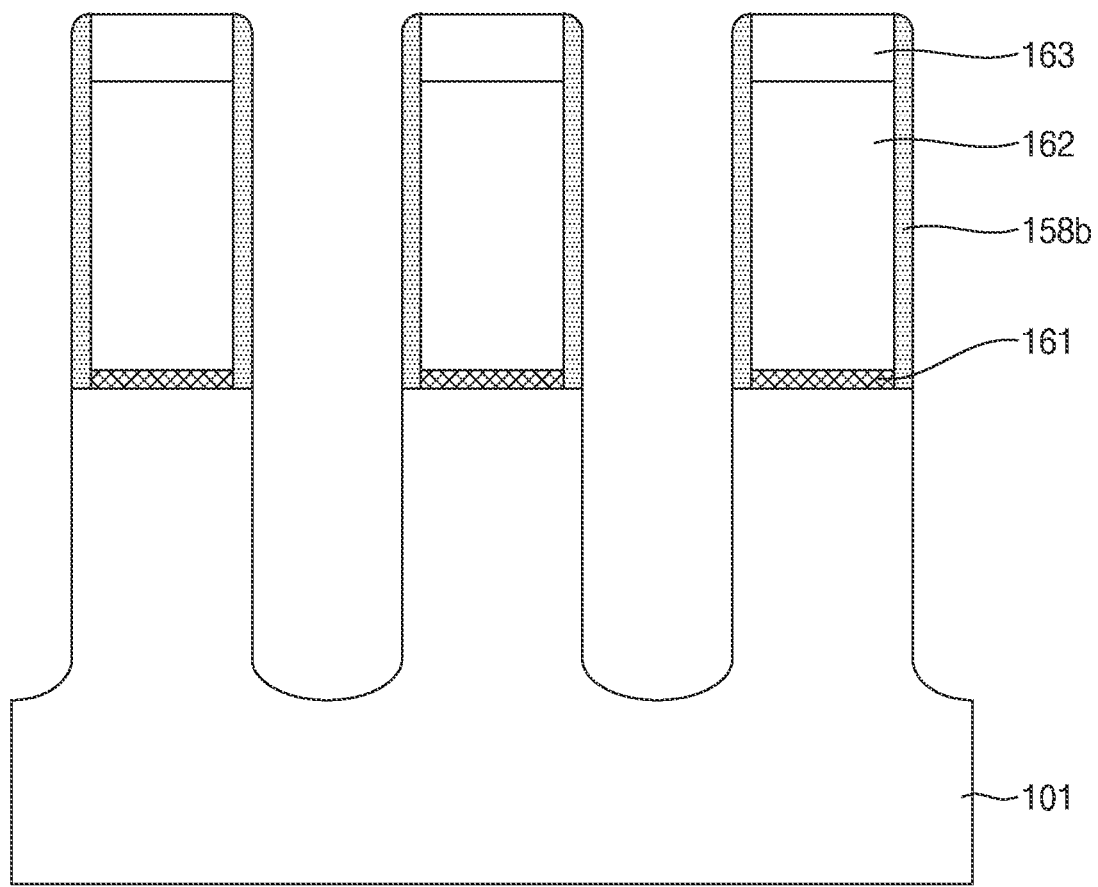

Next, referring to operation S320 of FIG. 26, portions, among the plurality of vertical pattern structures, of the resultant base substrate material designated by reference numeral "101" may be removed through a wet etching process. Vertical grooves may be formed at the base substrate material 101 through removal of the portions of the base substrate material 101. The vertical grooves may have a predetermined depth.

Figure 27:
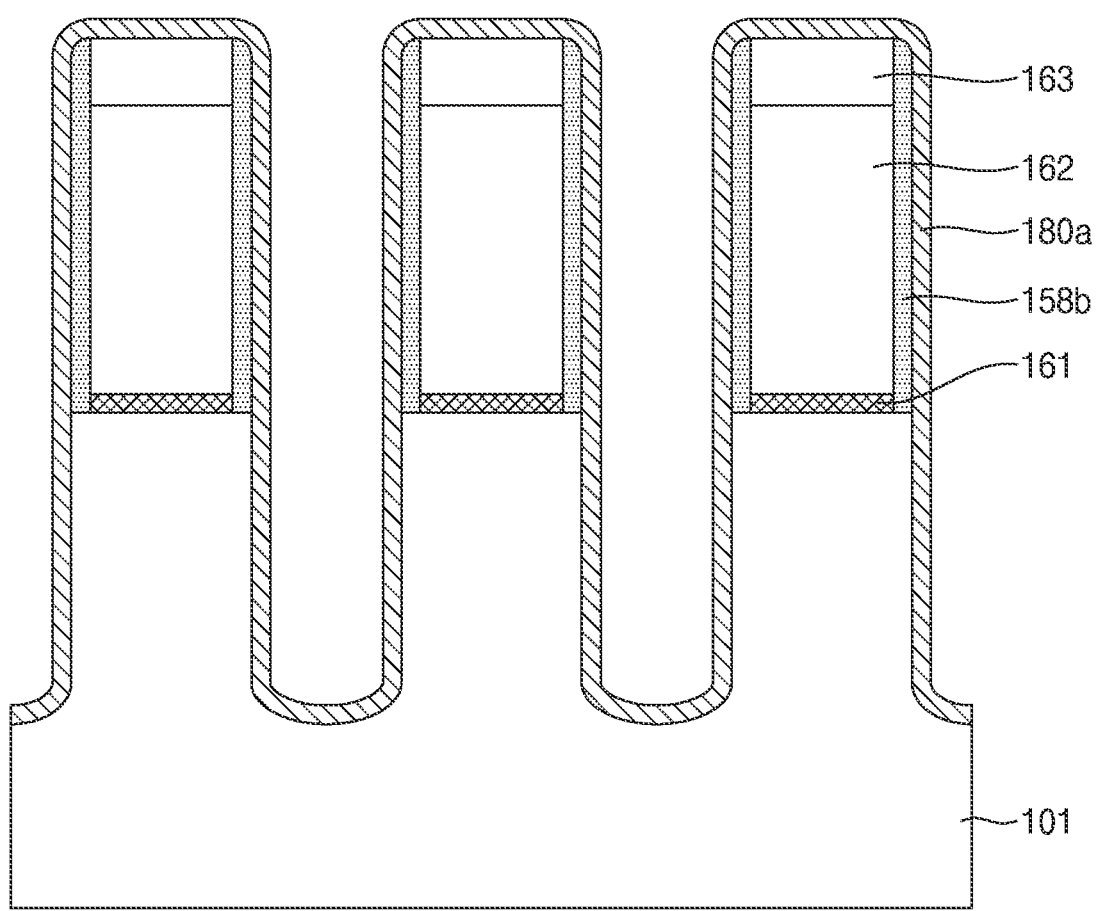

Thereafter, referring to operation S330 of FIG. 27, a first spacer material 180a may be formed to cover or overlap the vertical grooves and to cover or overlap the plurality of vertical pattern structures. The first spacer material 180a may include the same material as the first spacer 181.

Figure 28:
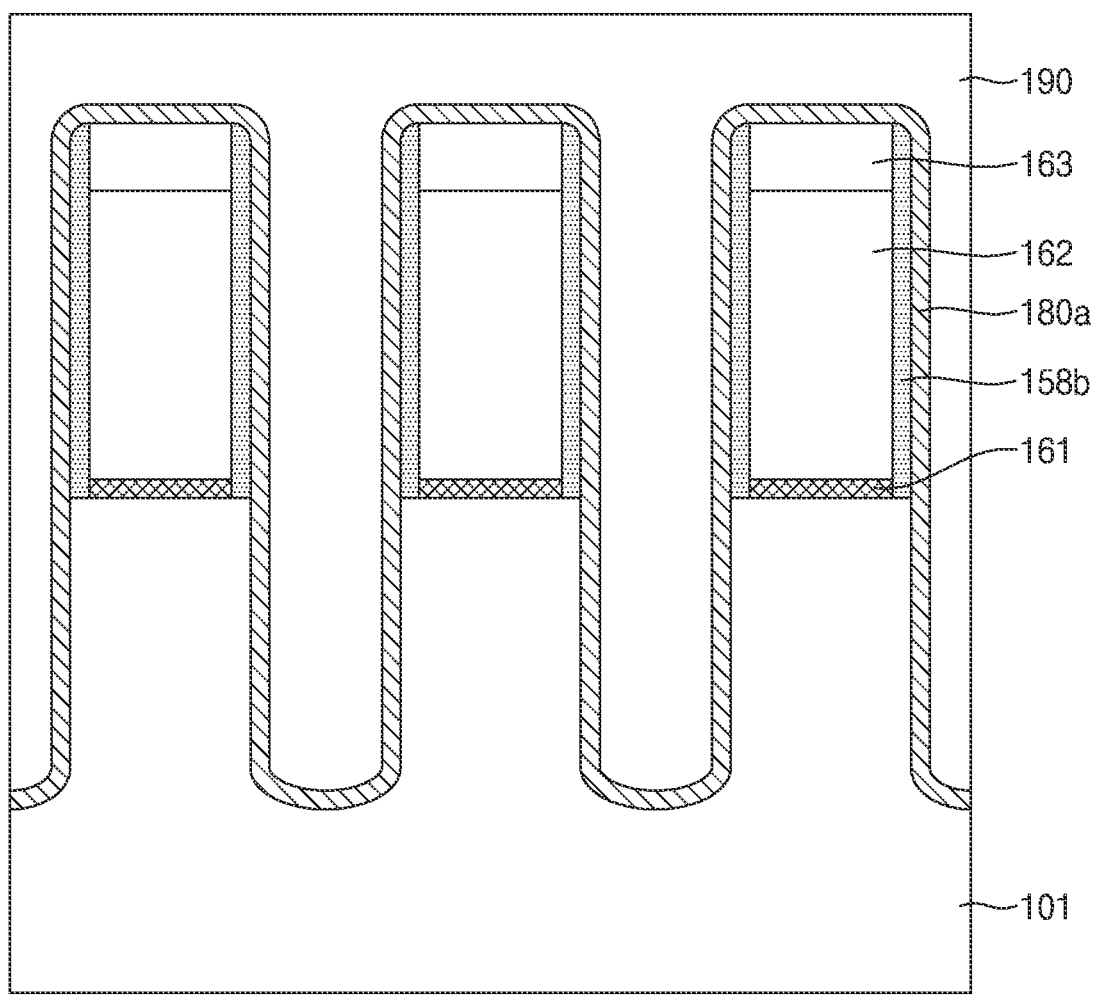

Next, referring to operation S340 of FIG. 28, a coating material 190 may be formed in a region where no process will be performed from among a first element region RX1 and a second element region RX2. For example, the coating material 190 may be formed over the entire surface of the second element region RX2, for execution of a process in the first element region RX1. For example, the coating material 190 may include SOH.

Figure 29:
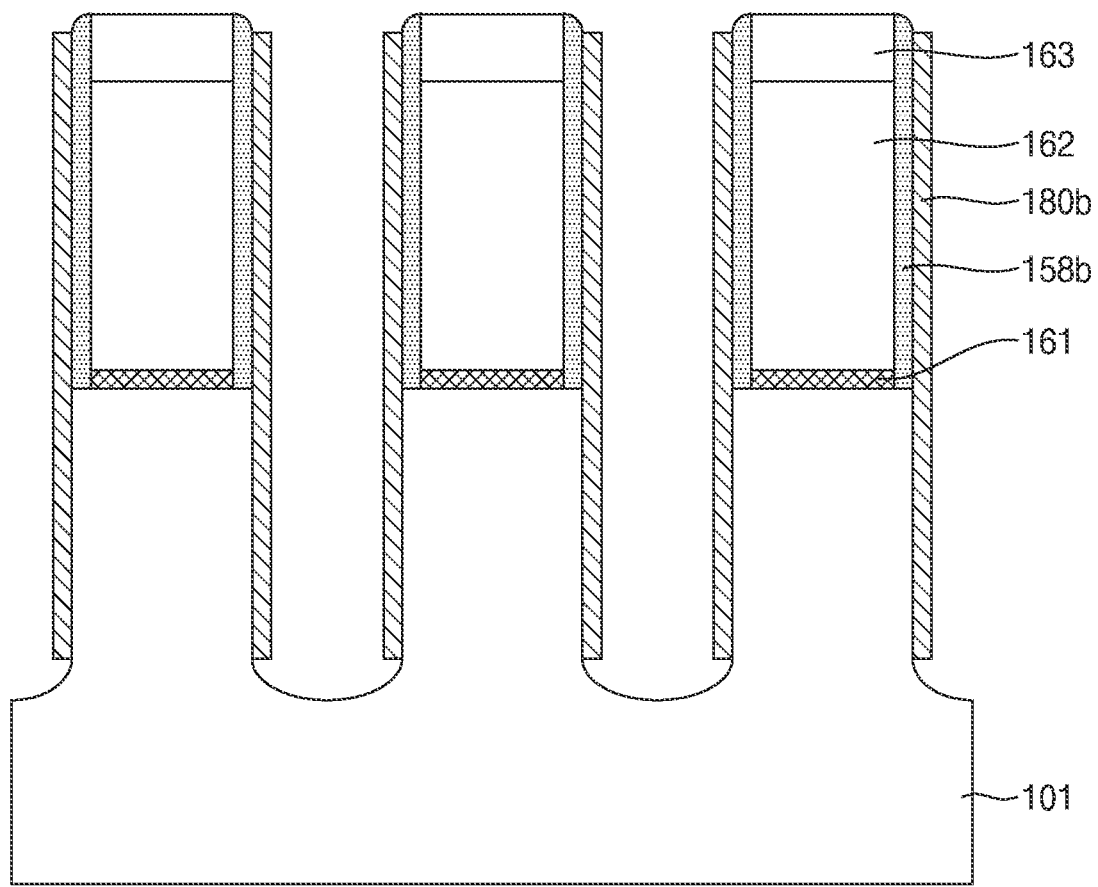

Thereafter, referring to operation S350 of FIG. 29, the coating material 190 may be removed through an etching process, and portions of the first spacer material 180a disposed on the hard mask pattern 163 and beneath the vertical grooves may be removed through an etch-back process. The partially-removed first spacer material 180a may expose a top surface of the base substrate material 101 becoming a substrate and a top surface of the hard mask pattern 163. The remaining portion is denoted as first spacer material 180b.

Figure 30:
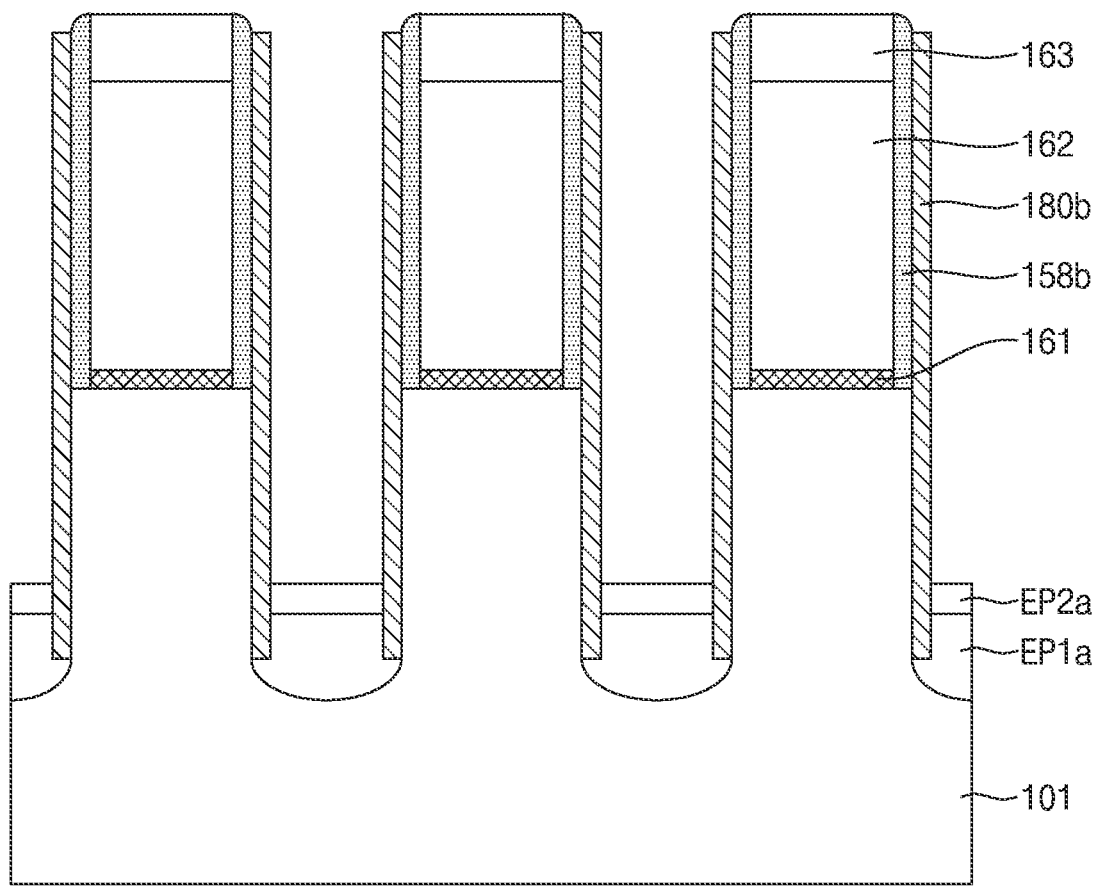

Next, referring to operation S360 of FIG. 30, a first epitaxial material EP1a and a second epitaxial material EP2a may be sequentially formed on the substrate 101 exposed in the vertical grooves. The first epitaxial material EP1a and the second epitaxial material EP2a may be formed to have predetermined heights extending from the top surface of the substrate 101 while contacting the first spacer material 180a.

Figure 31:
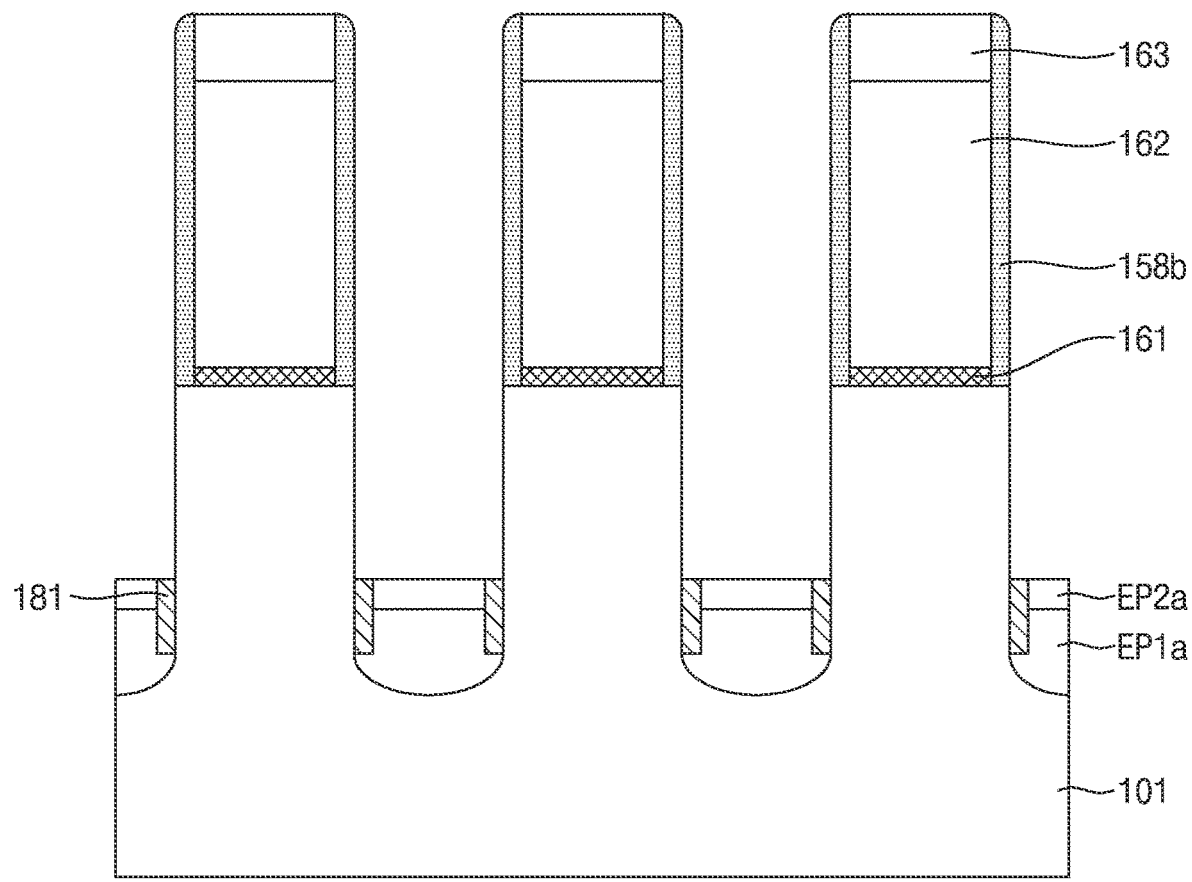

Thereafter, referring to operation S370 of FIG. 31, a portion of the first spacer material 180a may be removed through a stripping process. The first spacer material 180a may be removed, except for a portion thereof contacting the first epitaxial material EP1a and the second epitaxial material EP2a. As the first spacer material 180a is partially removed, the first spacer material 180a may become the first spacers 181 separate from one another.

Figure 32:
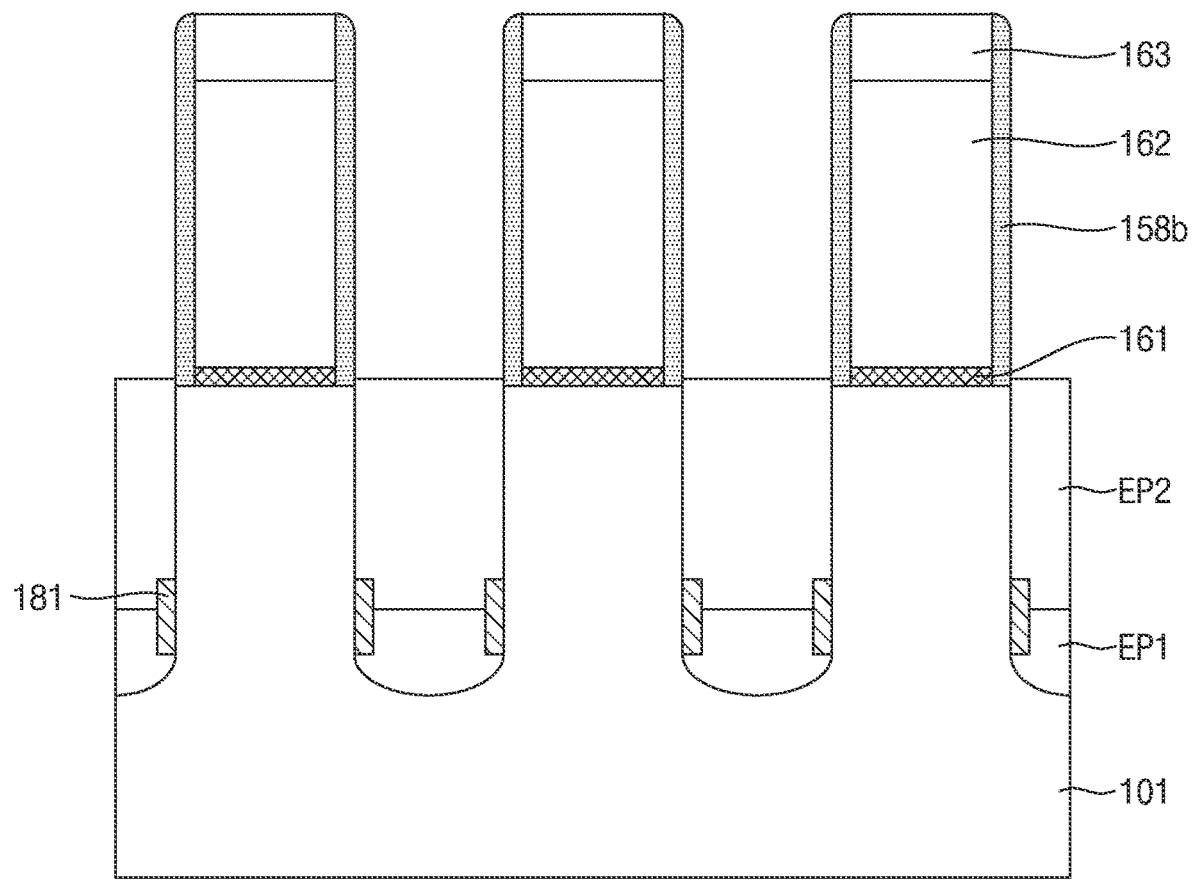

Subsequently, referring to operation S380 of FIG. 32, a process for growing the first epitaxial material EP1a or the second epitaxial material EP2a may be performed. The grown first epitaxial material EP1a and the second epitaxial material EP2a may become a source/drain region 230. The grown first epitaxial material EP1a and the second epitaxial material EP2a may become a first epitaxial region EP1 and a second epitaxial region EP2 of the source/drain region 230, respectively.

Although not clearly shown, a gate line 220 may then be formed in a region where the gate sacrificial pattern 162 and the hard mask pattern 163 are formed, through removal or replacement of the gate sacrificial pattern 162 and the hard mask pattern 163.

Figure 33:
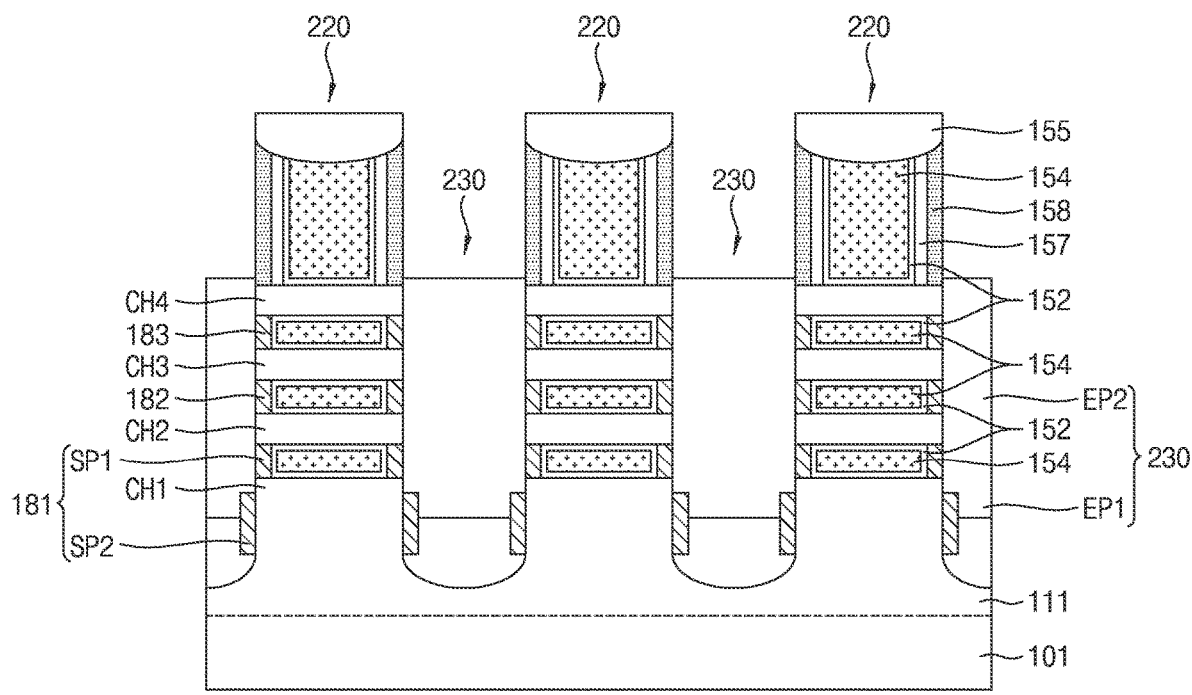
FIG. 33 is a schematic cross-sectional view of a semiconductor integrated circuit device according to example embodiments of the disclosure.

FIG. 33 is a schematic cross-sectional view of a semiconductor integrated circuit device according to example embodiments of the disclosure.

Referring to FIG. 33, the semiconductor integrated circuit device according to some embodiments differs from the semiconductor integrated circuit device according to the embodiments of FIG. 2 in that a first section SP1 and a second section SP2 of a first spacer 181 may be disposed to be spaced apart from each other.

The first section SP1 and the second section SP2 of the first spacer 181 may include the same material or may include different materials, respectively. The first section SP1 of the first spacer 181 may include the same material as a second spacer 182 and a third spacer 183.

In some embodiments, the first section SP1 and the second section SP2 of the first spacer 181 may be physically separated from each other. The first section SP1 and the second section SP2 of the first spacer 181 may include spacers that are separate from each other, respectively.

One side surface of the second section SP2 of the first spacer 181 may contact a first epitaxial region EP1 and/or a second epitaxial region EP2, and the other side surface of the second section SP2 of the first spacer 181 may contact a first channel CH1.

Figure 34:
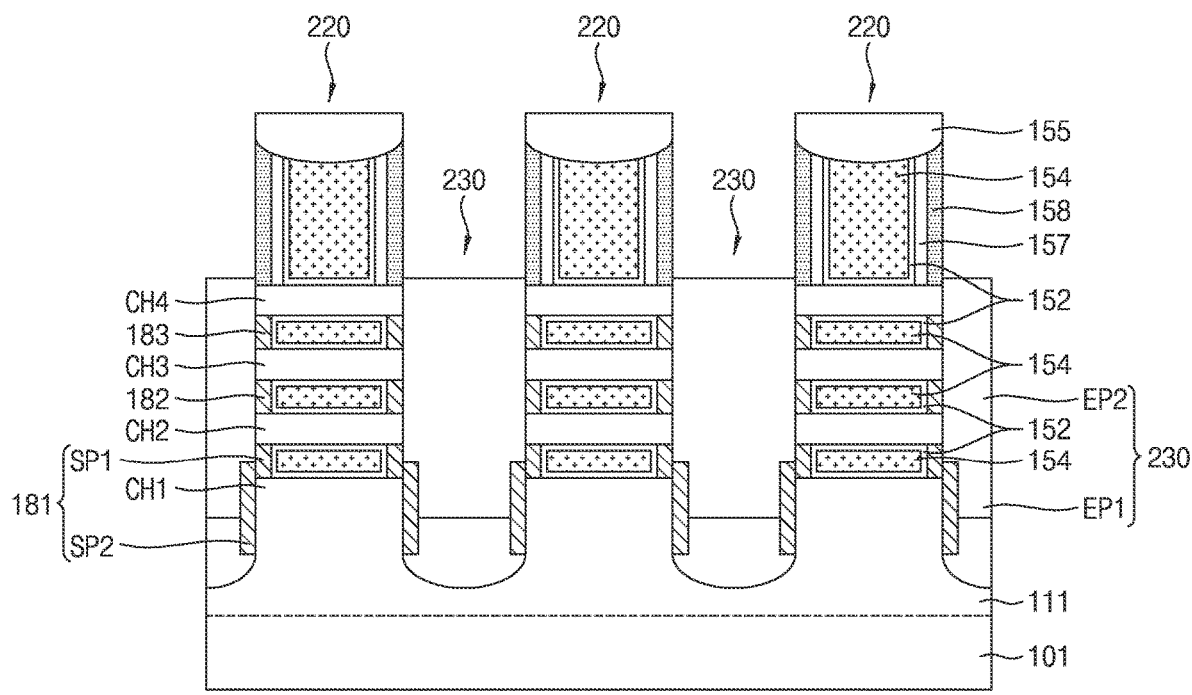
FIG. 34 is a schematic cross-sectional view of a semiconductor integrated circuit device according to example embodiments of the disclosure.

FIG. 34 is a schematic cross-sectional view of a semiconductor integrated circuit device according to example embodiments of the disclosure.

Referring to FIG. 34, the semiconductor integrated circuit device according to some embodiments differs from the semiconductor integrated circuit device according to the embodiments of FIG. 2 in that a step is formed between top surfaces of a first section SP1 and a second section SP2 of a first spacer 181.

For example, the top surface of the second section SP2 may be disposed between the top surface of the first section SP1 and a bottom surface of the first section SP1.

Figure 35:
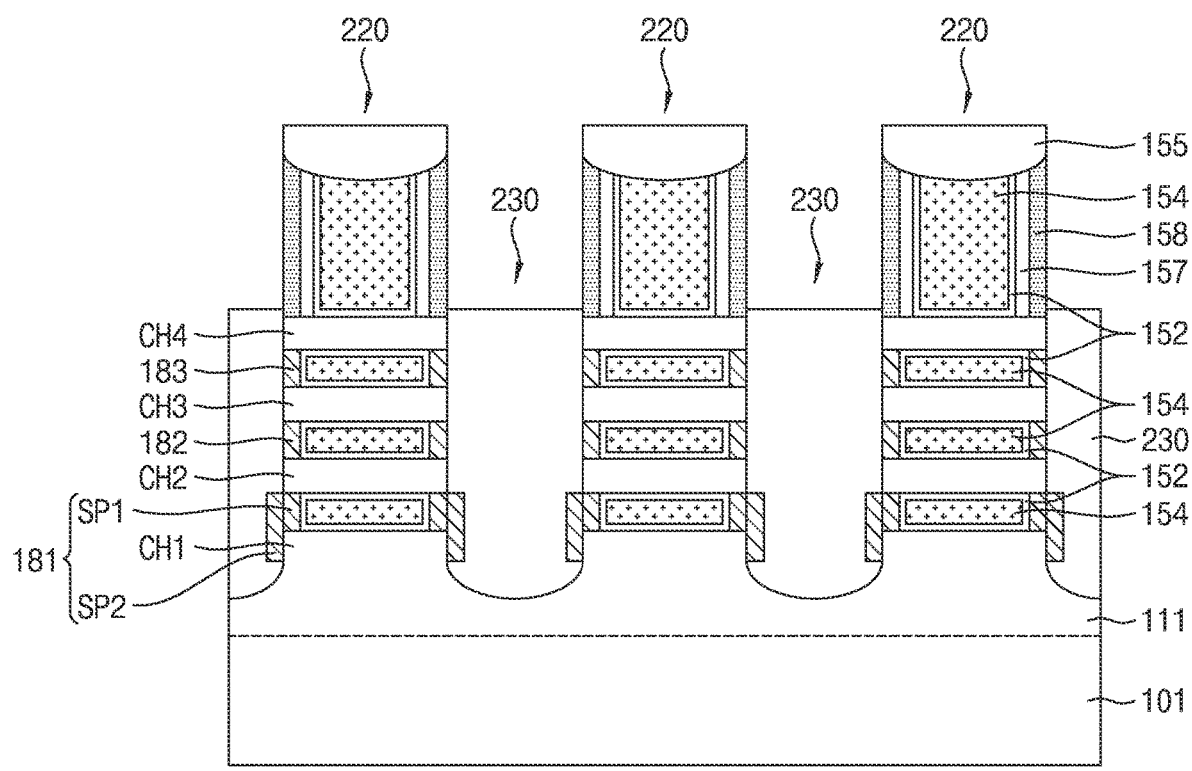
FIG. 35 is a schematic cross-sectional view of a semiconductor integrated circuit device according to example embodiments of the disclosure.

FIG. 35 is a schematic cross-sectional view of a semiconductor integrated circuit device according to example embodiments of the disclosure.

Referring to FIG. 35, the semiconductor integrated circuit device according to some embodiments differs from the semiconductor integrated circuit device according to the embodiments of FIG. 2 in that a first epitaxial region EP1 is omitted from a source/drain region 230.

In some embodiments, the source/drain region 230 may be configured by a single epitaxial region. The source/drain region 230 may be of a type different from that of an element region where the source/drain region 230 is disposed.

One side surface, a top surface and a bottom surface of a second section SP2 of a first spacer 181 may contact the source/drain region 230.

Figure 36:
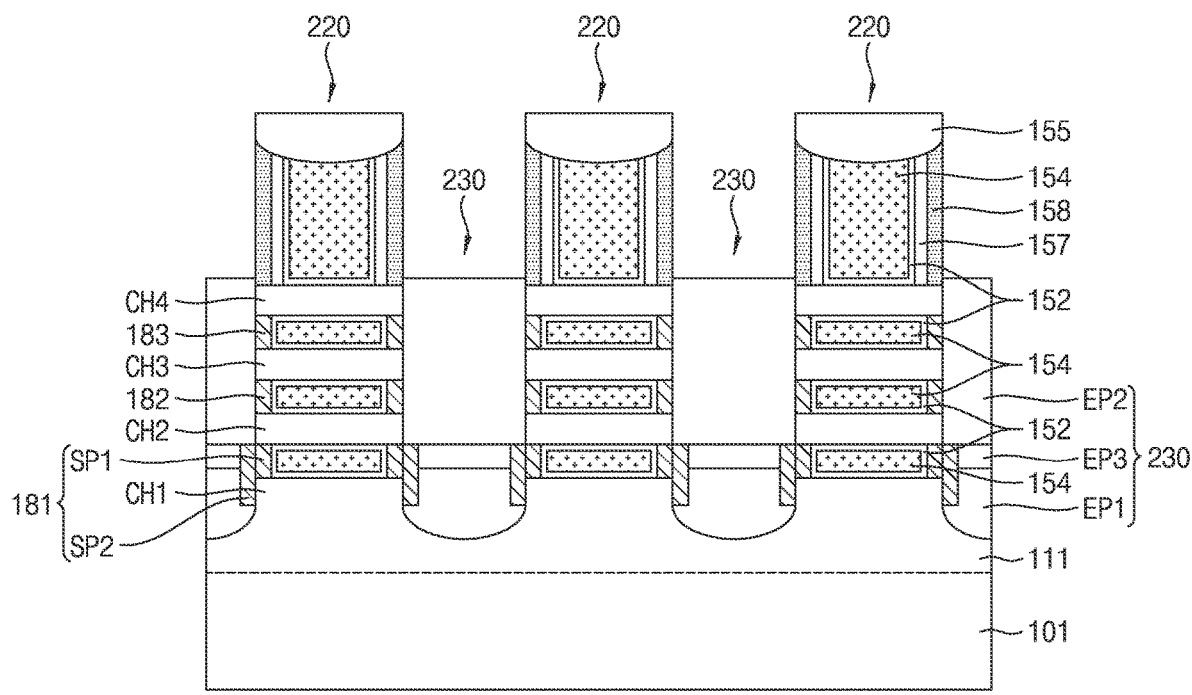
FIG. 36 is a schematic cross-sectional view of a semiconductor integrated circuit device according to an example embodiment of the disclosure.

FIG. 36 is a schematic cross-sectional view of a semiconductor integrated circuit device according to example embodiments of the disclosure.

Referring to FIG. 36, the semiconductor integrated circuit device according to some embodiments differs from the semiconductor integrated circuit device according to the embodiments of FIG. 2 in that a source/drain region 230 further includes a third epitaxial region EP3.

The source/drain region 230 may include multiple epitaxial layers (for example, three layers or more). For example, the source/drain region 230 may further include the third epitaxial region EP3 disposed between a first epitaxial region EP1 and a second epitaxial region EP2. The third epitaxial region EP3 may be of the same type as the first epitaxial region EP1 or the second epitaxial region EP2. The third epitaxial region EP3 may include a material different from that of the first epitaxial region EP1 or the second epitaxial region EP2.

In some embodiments, one side surface of the second section SP2 of the first spacer 181 may contact the first epitaxial region EP1 and the third epitaxial region EP3, a bottom surface of the second section SP2 may contact the first epitaxial region EP1, and a top surface of the second section SP2 may contact the second epitaxial region EP2.

Figure 37:
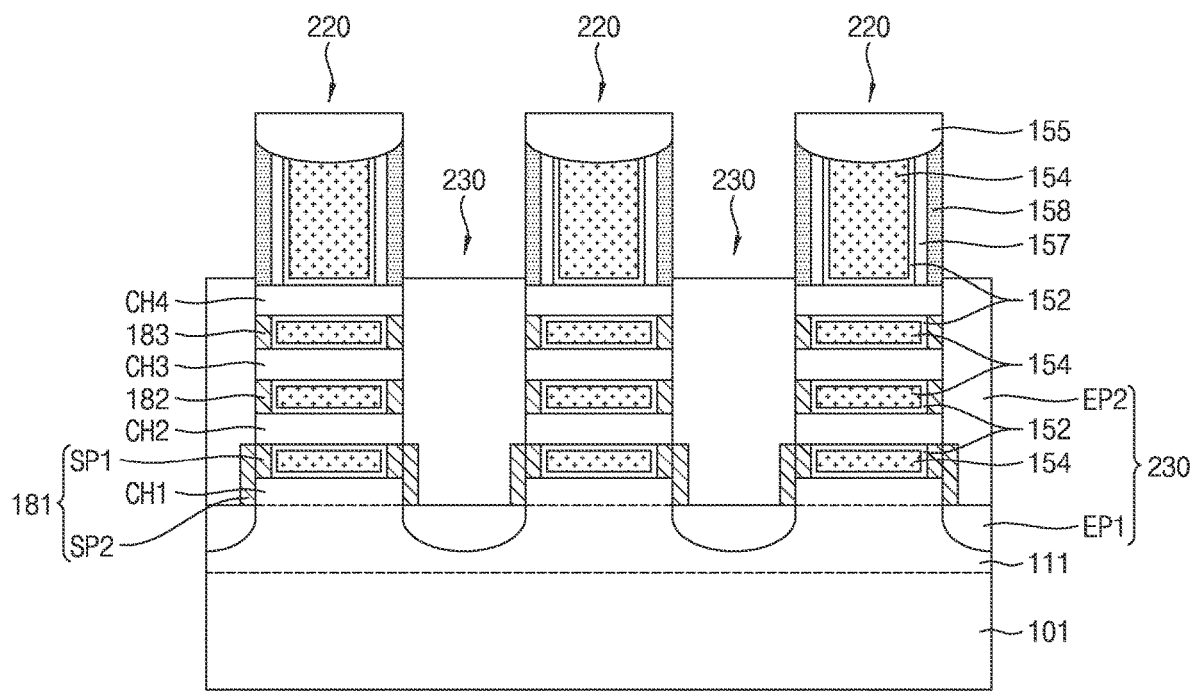
FIG. 37 is a schematic cross-sectional view of a semiconductor integrated circuit device according to example embodiments of the disclosure.

FIG. 37 is a schematic cross-sectional view of a semiconductor integrated circuit device according to example embodiments of the disclosure.

Referring to FIG. 37, the semiconductor integrated circuit device according to some embodiments differs from the semiconductor integrated circuit device according to the embodiments of FIG. 2 in that all portions of a second section SP2 of a first spacer 181 are disposed to be higher than a first epitaxial region EP1.

In some embodiments, one side surface of the second section SP2 of the first spacer 181 may contact only the first epitaxial region EP1. In this case, a bottom surface of the second section SP2 may contact a second epitaxial region EP2.

Figure 38:
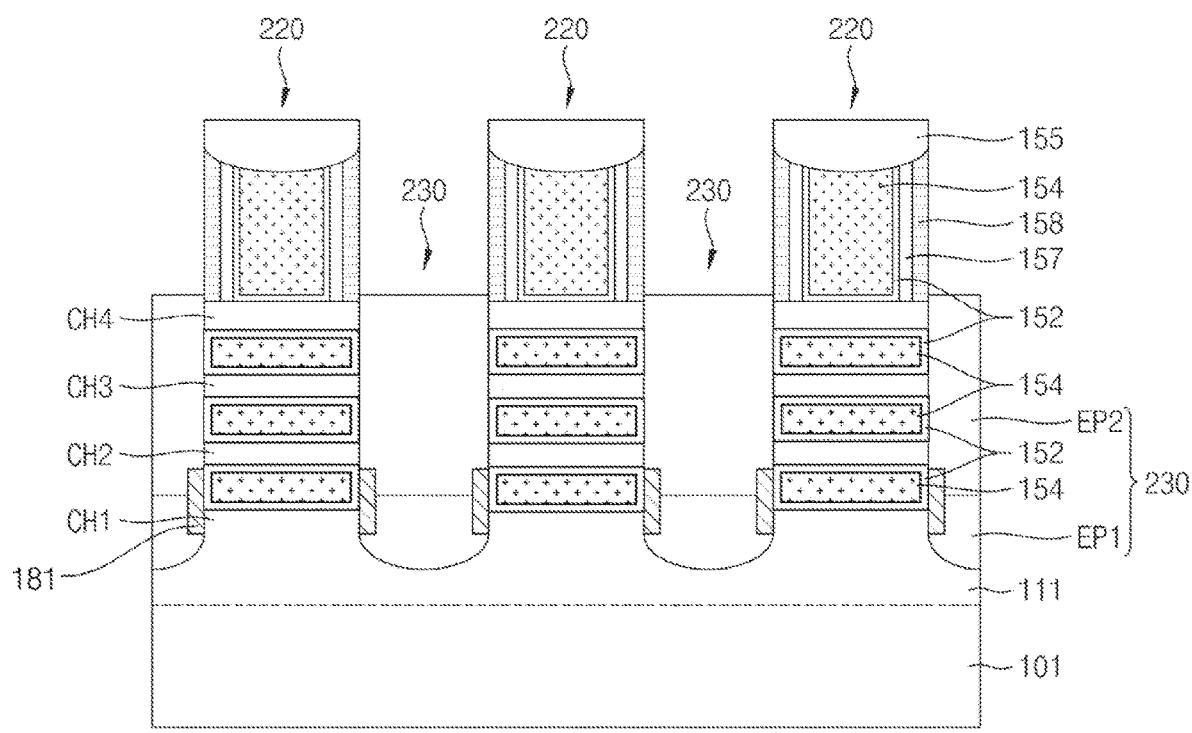
FIG. 38 is a schematic cross-sectional view of a semiconductor integrated circuit device according to example embodiments of the disclosure.

FIG. 38 is a schematic cross-sectional view of a semiconductor integrated circuit device according to an example embodiment of the disclosure.

Referring to FIG. 38, the semiconductor integrated circuit device according to some embodiments differs from the semiconductor integrated circuit device according to the embodiments of FIG. 2 in that a first section SP1 of a first spacer 181, a second spacer 182 and a third spacer 183 are omitted.

In some embodiments, the first spacer 181 may be formed only in a region penetrating a source/drain region 230. The first spacer 181 may not contact a second channel CH2. The first spacer 181 may not overlap with the second channel CH2 in a vertical/horizontal direction (for example, a first direction D1 and a third direction D3).

In accordance with the example embodiments of the disclosure, it may be possible to minimize or reduce leakage of current through a lower side of a channel between adjacent source/drain regions.

While the embodiments of the disclosure have been described with reference to the accompanying drawings, it should be understood by those skilled in the art that various modifications may be made without departing from the scope of the disclosure. Therefore, the above-described embodiments should be considered in a descriptive sense only and not for purposes of limitation.

What is claimed is:

1. A semiconductor integrated circuit device comprising:
   a substrate comprising a first element region of a P type and a second element region of an N type;
   a channel active region that extends into the first element region or the second element region in a first direction, wherein the channel active region comprises a plurality of channels;
   a plurality of gate lines that extend in a second direction intersecting the first direction, wherein each of the plurality of gate lines comprises a gate metal layer and a gate insulating film in contact with the gate metal layer;
   a plurality of first spacers on opposite side portions of the plurality of gate lines, wherein the plurality of first spacers are separated from one another; and
   a plurality of source/drain regions that are between the plurality of gate lines,
   wherein the channel active region comprises a first channel directly on the substrate, and a second channel spaced apart from the first channel in a third direction perpendicular to the first direction and the second direction and extends into the gate metal layer,
   wherein a width in the first direction of the second channel is greater than respective widths in the first direction of the gate metal layer and the gate insulating film that are between the first channel and the second channel,
   wherein the first channel, the second channel, and portions of the gate lines between the first channel and the second channel have a first groove therebetween,
   wherein a first spacer of the plurality of first spacers comprises a first section in the first groove and a second section that penetrates a first source/drain region of the plurality of source/drain regions, and
   wherein a lower insulating film is disposed directly on the substrate on opposite side portions of the first channel in the second direction.

2. The semiconductor integrated circuit device according to claim 1, wherein the first section of the first spacer overlaps the second channel in the third direction, and
   wherein the second section of the first spacer overlaps the first source/drain region in the third direction.

3. The semiconductor integrated circuit device according to claim 2, wherein a thickness of the second section of the first spacer is greater than a thickness of the first section of the first spacer.

4. The semiconductor integrated circuit device according to claim 2, wherein the first section of the first spacer contacts the gate insulating film.

5. The semiconductor integrated circuit device according to claim 1, wherein the first source/drain region of the plurality of source/drain regions comprises:
a first epitaxial region on the substrate; and
a second epitaxial region on the first epitaxial region and having a second conductivity type different from a first conductivity type of the first epitaxial region.

6. The semiconductor integrated circuit device according to claim 5, wherein the second channel contacts respective second epitaxial regions of ones of the plurality of source/drain regions at opposite side portions of the second channel.

7. The semiconductor integrated circuit device according to claim 5, wherein the second section of the first spacer is on the first epitaxial region.

8. The semiconductor integrated circuit device according to claim 5, wherein a top surface of the first epitaxial region is lower than a bottom surface of the second channel with respect to the substrate.

9. The semiconductor integrated circuit device according to claim 5,
wherein the first epitaxial region is of the P type and the channel active region is in the first element region, and
wherein the first epitaxial region is of the N type and the channel active region is in the second element region.

10. The semiconductor integrated circuit device according to claim 5,
wherein the channel active region further comprises a third channel spaced apart from the second channel in the third direction and extending through the gate metal layer, and
wherein the third channel contacts respective second epitaxial regions of ones of the source/drain regions at opposite sides of the third channel.

11. The semiconductor integrated circuit device according to claim 10, wherein the second channel, the third channel, and portions of the gate lines between the second channel and the third channel have a second groove therebetween.

12. The semiconductor integrated circuit device according to claim 11, further comprising:
a plurality of second spacers on the opposite side portions of the gate lines in the second groove.

13. The semiconductor integrated circuit device according to claim 12,
wherein the plurality of second spacers do not overlap with any of the plurality of source/drain regions in the third direction.

14. The semiconductor integrated circuit device according to claim 1,
wherein the first section of the first spacer and the second section of the first spacer comprise different materials, respectively, and
wherein the first section of the first spacer and the second section of the first spacer are separated from each other.

15. The semiconductor integrated circuit device according to claim 1, wherein the gate insulating film comprises a ferroelectric material film having ferroelectric characteristics and a negative capacitance, and a paraelectric material film having paraelectric characteristics and a positive capacitance.

16. A semiconductor integrated circuit device comprising:
a substrate comprising a first element region of a P type and a second element region of an N type;
a channel active region that extends into the first element region or the second element region in a first direction, wherein the channel active region comprises a plurality of channels;
a plurality of gate lines that extend in a second direction intersecting the first direction,
wherein each of the plurality of gate lines comprises a gate metal layer and a gate insulating film in contact with the gate metal layer;
source/drain regions that are between the plurality of gate lines, wherein a first source/drain region of the source/drain regions comprises a first epitaxial region and a second epitaxial region of different conductivity types; and
a plurality of first spacers on opposite side portions of the plurality of gate lines,
wherein a first spacer of the plurality of first spacers is between the first epitaxial region and the second epitaxial region of the first source/drain region, and overlaps a respective one of the plurality of gate lines in the first direction, and
wherein a lower insulating film is disposed directly on the substrate on opposite side portions of one of the plurality of channels in the second direction.

17. The semiconductor integrated circuit device according to claim 16, wherein the first spacer comprises:
a first section that contacts the gate insulating film; and
a second section that contacts both the first epitaxial region and the second epitaxial region of the first source/drain region.

18. The semiconductor integrated circuit device according to claim 17, wherein a top surface of the second section of the first spacer contacts the first epitaxial region, and a bottom surface of the second section of the first spacer contacts the second epitaxial region.

19. The semiconductor integrated circuit device according to claim 16, wherein the first epitaxial region is of a same conductivity type as the first element region or the second element region into which the channel active region extends.

20. A semiconductor integrated circuit device comprising:
a substrate comprising a first element region of a P type and a second element region of an N type;
a channel active region that extends into the first element region or the second element region in a first direction, wherein the channel active region comprises a plurality of channels;
a plurality of gate lines that extend in a second direction intersecting the first direction, wherein each of the plurality of gate lines comprises a gate metal layer and a gate insulating film in contact with the gate metal layer;
a plurality of spacers on opposite side portions of the gate lines, wherein the plurality of spacers are separated from one another; and
a plurality of source/drain regions that are between the plurality of gate lines,
wherein the channel active region comprises:
a first channel directly on the substrate,
a second channel spaced apart from the first channel in a third direction perpendicular to the first direction and the second direction and extends into the gate metal layer, and
a third channel spaced apart from the second channel in the third direction and extending into the gate metal layer,
wherein respective widths in the first direction of the second channel and the third channel are greater than respective widths in the first direction of the gate metal layer and the gate insulating film that are between the first channel and the second channel, wherein the first channel, the second channel, and respective portions of first ones of the gate lines between the first channel and the second channel have a first groove therebetween, wherein the second channel, the third channel, and respective portions of second ones of the gate lines between the second channel and the third channel have a second groove therebetween, wherein the plurality of spacers comprises:
- a first spacer comprising a first section in the first groove, and a second section that penetrates a first source/drain region of the plurality of source/drain regions,
- a second spacer in the second groove,
- a third spacer on the third channel at an outside of a part of a respective one of the gate lines, and
- a fourth spacer on the third channel at an outside of the third spacer, wherein the first source/drain region comprises a first epitaxial region and a second epitaxial region of different conductivity types, wherein the first spacer is directly on the first epitaxial region and is directly on the second epitaxial region, wherein the second spacer contacts the second epitaxial region, and wherein a lower insulating film is disposed directly on the substrate on opposite side portions of the first channel in the second direction.

* * * * *